United States Patent
Kim et al.

(10) Patent No.: US 12,310,250 B2
(45) Date of Patent: *May 20, 2025

(54) MAGNETIC TUNNELING JUNCTION DEVICE AND MEMORY DEVICE INCLUDING THE SAME

(71) Applicant: Samsung Electronics Co., Ltd., Suwon-si (KR)

(72) Inventors: Kwangseok Kim, Seoul (KR); Kiwoong Kim, Hwaseong-si (KR); Jeongchun Ryu, Hwaseong-si (KR); Seonggeon Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 60 days.

This patent is subject to a terminal disclaimer.

(21) Appl. No.: 17/983,796

(22) Filed: Nov. 9, 2022

(65) Prior Publication Data

US 2023/0225220 A1    Jul. 13, 2023

Related U.S. Application Data

(63) Continuation-in-part of application No. 17/847,103, filed on Jun. 22, 2022.

(30) Foreign Application Priority Data

Jan. 7, 2022  (KR) .................. 10-2022-0002960
Jun. 15, 2022 (KR) .................. 10-2022-0073058

(51) Int. Cl.
*G11C 11/16*   (2006.01)
*G01R 33/09*   (2006.01)
(Continued)

(52) U.S. Cl.
CPC .......... *H10N 50/10* (2023.02); *G01R 33/098* (2013.01); *G11C 11/161* (2013.01);
(Continued)

(58) Field of Classification Search
CPC ...... G11C 11/161; H10N 50/10; H10N 50/80; H10N 50/01; H10B 61/00
See application file for complete search history.

(56) References Cited

U.S. PATENT DOCUMENTS 7,067,331 B2    6/2006  Slaughter et al.
9,166,143 B1 * 10/2015  Gan ................ G11C 11/161
(Continued)

FOREIGN PATENT DOCUMENTS

EP    2 159 858 A1    3/2010
EP    3 813 066 A1    4/2021
(Continued)

OTHER PUBLICATIONS

U.S. Office Action dated May 20, 2024 issued in co-pending U.S. Appl. No. 17/847,103.
(Continued)

*Primary Examiner* — Min Huang
(74) *Attorney, Agent, or Firm* — Harness, Dickey & Pierce, P.L.C.

(57) ABSTRACT

Provided are a magnetic tunneling junction device having a relatively high tunneling magnetoresistance (TMR) ratio; and a memory device including the magnetic tunneling junction device. The magnetic tunneling junction device includes: a pinned layer having a first surface and a second surface opposite the first surface; a seed layer disposed in contact with the first surface of the pinned layer; a free layer disposed to face the second surface of the pinned layer; and a tunnel barrier layer disposed between the pinned layer and the free layer, wherein the seed layer includes at least one (Continued)

amorphous material selected from CoFeX and CoFeXTa, and the X includes at least one element selected from niobium (Nb), molybdenum (Mo), tungsten (W), chromium (Cr), zirconium (Zr), and hafnium (Hf). The seed layer may not include boron.

20 Claims, 26 Drawing Sheets

(51) Int. Cl.
  H01F 10/32    (2006.01)
  H10B 61/00    (2023.01)
  H10N 50/01    (2023.01)
  H10N 50/10    (2023.01)
  H10N 50/80    (2023.01)
  H10N 50/85    (2023.01)
(52) U.S. Cl.
  CPC ......... *H01F 10/3272* (2013.01); *H10B 61/00* (2023.02); *H10N 50/01* (2023.02); *H10N 50/80* (2023.02); *H10N 50/85* (2023.02)

(56) References Cited

U.S. PATENT DOCUMENTS

| | | | |
|---|---|---|---|
| 9,425,387 | B1 | 8/2016 | Liu et al. |
| 9,673,385 | B1 | 6/2017 | Liu et al. |
| 10,050,083 | B2 | 8/2018 | Gan et al. |
| 10,439,131 | B2 | 10/2019 | Siddik et al. |
| 10,522,747 | B2 | 12/2019 | Zhu et al. |
| 10,720,469 | B2 | 7/2020 | Wang et al. |
| 10,964,883 | B2 | 3/2021 | Watanabe et al. |
| 11,251,364 | B2 | 2/2022 | Xue et al. |
| 11,348,715 | B2 | 5/2022 | Jung et al. |
| 2005/0189574 | A1 | 9/2005 | Nguyen et al. |
| 2006/0017081 | A1 | 1/2006 | Sun et al. |
| 2009/0251829 | A1* | 10/2009 | Zhang ................. G11B 5/3983 360/319 |
| 2013/0028013 | A1* | 1/2013 | Ikeda ................... H10N 50/10 365/158 |
| 2014/0084398 | A1* | 3/2014 | Oguz ................... G11C 11/161 257/E29.323 |
| 2014/0175574 | A1* | 6/2014 | Watts ............... H01L 29/66007 257/421 |
| 2019/0198566 | A1 | 6/2019 | Wang et al. |
| 2020/0144487 | A1 | 5/2020 | Zhu et al. |
| 2020/0185016 | A1* | 6/2020 | Sakhare ................ H10N 50/85 |
| 2021/0193914 | A1 | 6/2021 | Xue et al. |
| 2021/0249038 | A1 | 8/2021 | Le et al. |
| 2021/0320247 | A1 | 10/2021 | Xue et al. |
| 2021/0343930 | A1* | 11/2021 | Hsu ...................... H10B 61/22 |
| 2023/0225219 | A1* | 7/2023 | Kim ..................... H10B 61/00 365/158 |

FOREIGN PATENT DOCUMENTS

| | | |
|---|---|---|
| JP | 2005-539376 A | 12/2005 |
| JP | 2017-220533 A | 12/2017 |
| JP | 2020-527865 A | 9/2020 |
| JP | 2021-523569 A | 9/2021 |
| KR | 10-2020-0010415 A | 1/2020 |

OTHER PUBLICATIONS

Extended European Search Report dated May 23, 2023 issued in European Patent Application No. 22187508.1-1211.
U.S. Office Action dated Mar. 19, 2024 issued in co-pending U.S. Appl. No. 17/847,103.
U.S. Office Action dated Jan. 3, 2024 issued in co-pending U.S. Appl. No. 17/847,103.
U.S. Office Action dated Sep. 25, 2024 issued in related U.S. Appl. No. 17/847,103.
U.S. Notice of Allowance dated Apr. 14, 2025 for corresponding U.S. Appl. No. 17,847,103.

* cited by examiner

MAGNETIC TUNNELING JUNCTION DEVICE AND MEMORY DEVICE INCLUDING THE SAME

CROSS-REFERENCE TO RELATED APPLICATION

This application is a continuation-in-part of U.S. application Ser. No. 17/847,103, filed on Jun. 22, 2022 in the United Stated Patent and Trademark Office, which claims priority from Korean Patent Application No. 10-2022-0002960, filed on Jan. 7, 2022, and Korean Patent Application No. 10-2022-0073058, filed on Jun. 15, 2022 in the Korean Intellectual Property Office, the disclosures of each of which are incorporated by reference herein in its entirety.

BACKGROUND

Example embodiments relate to magnetic tunneling junction devices and memory devices including the magnetic tunneling junction devices and, more particularly, to magnetic tunneling junction devices having a high tunneling magnetoresistance (TMR) ratio, and/or memory devices including the magnetic tunneling junction devices.

A magnetic memory device such as magnetic random-access memory (MRAM) stores data by using a change in the resistance of a magnetic tunneling junction device. The resistance of a magnetic tunneling junction device varies with the magnetization direction of a free layer. For example, when the magnetization direction of the free layer is the same as the magnetization direction of a pinned layer, e.g. are parallel with each other, the magnetic tunneling junction device may have low resistance, and when the magnetization directions are opposite to each other, e.g. are antiparallel with each other, the magnetic tunneling junction device may have high resistance. When this characteristic is used in a memory device, for example, a magnetic tunneling junction device having low resistance may correspond to data such as logical '0' and a magnetic tunneling junction device having high resistance may correspond to data such as logical '1'. In order to improve the performance of such a magnetic tunneling junction device, a tunneling magnetoresistance (TMR) ratio having a high value is beneficial.

SUMMARY

Provided are magnetic tunneling junction devices having a relatively high tunneling magnetoresistance (TMR) ratio and/or memory devices including the magnetic tunneling junction devices.

Alternatively or additionally, provided are magnetic tunneling junction devices having a relatively high exchange field (Hex) and memory devices including the magnetic tunneling junction devices.

Alternatively or additionally, provided are magnetic tunneling junction devices that may be manufactured by performing heat treatment at a temperature equal to or greater than 300° C. and/or memory devices including the magnetic tunneling junction devices.

Additional aspects will be set forth in part in the description which follows and, in part, will be apparent from the description, or may be learned by practice of the various example embodiments.

According to some example embodiments, a magnetic tunneling junction device may include a pinned layer having a first surface and a second surface opposite the first surface; a seed layer in contact with the first surface of the pinned layer; a free layer facing the second surface of the pinned layer; and a tunnel barrier layer between the pinned layer and the free layer. The seed layer may includes a first seed layer facing the first surface of the pinned layer and a second seed layer between the first seed layer and the pinned layer. The first seed layer includes at least one amorphous CoFeX and does not comprises boron (B), where the X includes at least one element selected from niobium (Nb), molybdenum (Mo), tungsten (W), chromium (Cr), zirconium (Zr), and hafnium (Hf). The second seed layer comprises amorphous tantalum (Ta).

A proportion of the X in CoFeX may be about 5 at % to about 50 at %.

A thickness of the first seed layer may be or be about 5 Å (0.5 nm) to or to about 20 Å (1.5 nm).

A thickness of the second seed layer is 5 Å (0.5 nm) to 10 Å (1 nm).

A sum of a thickness of the first seed layer and a thickness of the second seed layer is 10 Å (1 nm) to 30 Å (3 nm).

The thickness of the second seed layer may be less than the thickness of the first seed layer.

The magnetic tunneling junction device may further include an anti-crystallized layer between the pinned layer and the tunnel barrier layer; and a polarization enhancing layer between the anti-crystallized layer and the tunnel barrier layer.

The seed layer and the anti-crystallized layer may be maintained in an amorphous state at a temperature of about 300° C. to about 500° C.

The anti-crystallized layer may include at least one of YCo, YFe, YCoFe, YCoB, YFeB or YCoFeB, and the Y may include at least one element selected from tungsten (W), rhenium (Re), molybdenum (Mo), and tantalum (Ta).

The anti-crystallized layer may include YFeB, a proportion of FeB in the anti-crystallized layer may be about 20 at % to about 60 at %, and a proportion of boron (B) in the FeB may be about 10 at % to about 30 at %.

A thickness of the anti-crystallized layer may be about 1.5 Å to about 10 Å.

The polarization enhancing layer may include CoFeB.

The polarization enhancing layer may include a first polarization enhancing layer in contact with the anti-crystallized layer, and a second polarization enhancing layer between the first polarization enhancing layer and the tunnel barrier layer.

Each of the first polarization enhancing layer and the second polarization enhancing layer may include CoFeB, and a proportion of boron (B) in the second polarization enhancing layer may be less than a proportion of boron (B) in the first polarization enhancing layer.

The proportion of boron (B) in the first polarization enhancing layer may be about 25 at % to about 35 at %, and the proportion of boron (B) in the second polarization enhancing layer may be about 15 at % to about 25 at %.

A thickness of the second polarization enhancing layer may be less than a thickness of the first polarization enhancing layer.

The thickness of the first polarization enhancing layer may be or be about 5 Å to or to about 7 Å, and the thickness of the second polarization enhancing layer may be or be about 1 Å to or to about 3 Å.

The pinned layer may include a first ferromagnetic layer in contact with the seed layer, a second ferromagnetic layer in contact with the anti-crystallized layer, and a synthetic antiferromagnet (SAF) coupling layer between the first ferromagnetic layer and the second ferromagnetic layer, and a magnetization direction of the first ferromagnetic layer and a magnetization direction of the second ferromagnetic layer may be opposite to each other.

The magnetic tunneling junction device may further include an oxide layer on the free layer.

According to an some example embodiments, a method of manufacturing a magnetic tunnel junction device includes forming a seed layer on an electrode; forming a pinned layer on the seed layer; forming an anti-crystallized layer on the pinned layer; performing a heat treatment for crystallizing the pinned layer; forming a polarization enhancing layer on the anti-crystallized layer; forming a tunnel barrier layer on the polarization enhancing layer; and forming a free layer on the tunnel barrier layer. The seed layer comprises at least one amorphous material selected from CoFeX and CoFeXTa, and the X comprises at least one element selected from niobium (Nb), molybdenum (Mo), tungsten (W), chromium (Cr), zirconium (Zr), and hafnium (Hf).

The heat treatment may be performed at a temperature of 300° C. to 500° C.

According to some example embodiments, a memory device includes a plurality of magnetic tunneling junction device and a plurality of switching devices, each of the plurality of switching devices being connected to a respective one of the plurality of magnetic tunneling junction devices, wherein the one of the plurality of magnetic tunneling junction devices includes a pinned layer having a first surface and a second surface opposite the first surface; a seed layer in contact with the first surface of the pinned layer; a free layer disposed to face the second surface of the pinned layer; and a tunnel barrier layer disposed between the pinned layer and the free layer. The seed layer includes at least one amorphous material selected from CoFeX and CoFeXTa, and the X includes at least one element selected from niobium (Nb), molybdenum (Mo), tungsten (W), chromium (Cr), zirconium (Zr), and hafnium (Hf).

According to some example embodiments, a magnetic junction tunneling device may include a pinned layer having a first surface and a second surface opposite the first surface; a seed layer contacting the first surface of the pinned layer; and a free layer facing the second surface of the pinned layer. The seed layer may include a first seed layer facing the first surface of the pinned layer and a second seed layer between the first seed layer and the pinned layer. The first seed layer comprises at least one amorphous CoFeX and does not comprises boron (B), and the X comprises at least one element selected from niobium (Nb), molybdenum (Mo), tungsten (W), chromium (Cr), zirconium (Zr), and hafnium (Hf). The second seed layer comprises amorphous tantalum (Ta).

The magnetic junction tunneling device may include an electrode contacting a surface of the seed layer.

A memory device may include the magnetic tunneling junction device; and a switching device including a first source/drain terminal, the first source/drain terminal connected to the electrode of the magnetic tunneling junction device.

The memory device may include a selection line; and a word line extending parallel with the selection line. The switching device may further include a second source/drain terminal connected to the selection line and a gate connected to the word line.

The memory device may include a bit line, wherein the free layer of the magnetic tunneling junction device is connected to the bit line.

BRIEF DESCRIPTION OF THE DRAWINGS

The above and other aspects, features, and/or advantages of certain example embodiments will be more apparent from the following description taken in conjunction with the accompanying drawings, in which.

DETAILED DESCRIPTION

Figure 1:
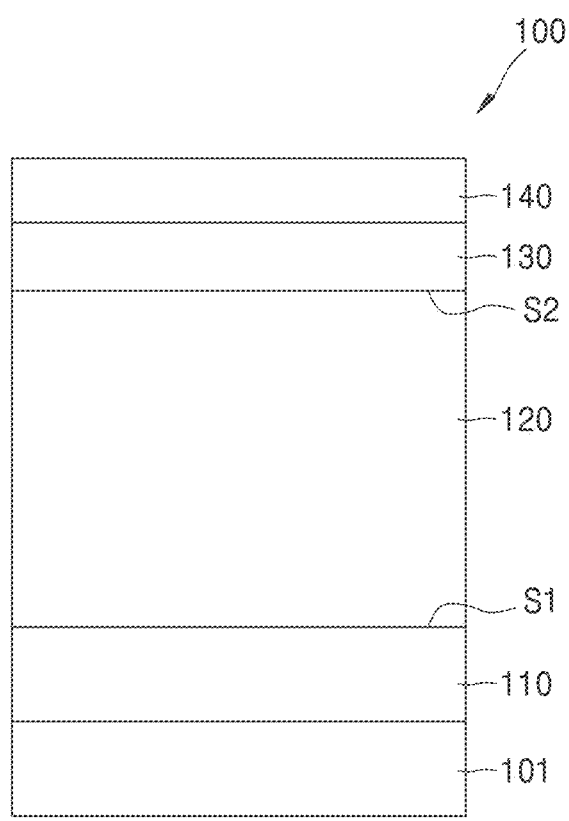
FIG. 1 is a cross-sectional view illustrating a schematic structure of a magnetic tunneling junction device according to some example embodiments.

Reference will now be made in detail to various embodiments, examples of which are illustrated in the accompanying drawings, wherein like reference numerals refer to like elements throughout. In this regard, example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, with reference to the accompanying drawings, a magnetic tunneling junction device and a memory device including the magnetic tunneling junction device will be described in detail. Like reference numerals refer to like elements throughout, and in the drawings, sizes of elements may be exaggerated for clarity and convenience of explanation. Various example embodiments described below are merely for illustrative purposes only, and various modifications may be possible.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to example embodiments is explicitly mentioned or described otherwise, the operations may be performed in a proper order. Example embodiments are not necessarily limited to the order the operations are mentioned.

The term used in the embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate various example embodiments and does not pose a limitation on the scope unless otherwise claimed.

FIG. 1 is a cross-sectional view illustrating a schematic structure of a magnetic tunneling junction device 100 according to some example embodiments. Referring to FIG. 1, the magnetic tunneling junction device 100 according to some example embodiments may include a seed layer 110 disposed on an electrode 101, a pinned layer 120 disposed on the seed layer 110, a tunnel barrier layer 130 disposed on the pinned layer 120, and a free layer 140 disposed on the tunnel barrier layer 130. Although not shown, a capping metal may or may not be further disposed on the free layer 140. Here, the expression "disposed on" is for convenience of description and does not necessarily mean a vertical relationship. For example, the seed layer 110 may be disposed to contact a first surface S1 of the pinned layer 120. The free layer 140 may be disposed to face a second surface S2 opposite to the first surface S1 of the pinned layer 120. In addition, the tunnel barrier layer 130 may be disposed between the pinned layer 120 and the free layer 140.

The electrode 101 may include a conductive material capable of applying a current to the magnetic tunneling junction device 100. The electrode 101 may include a low-resistance metal and/or a metal nitride. For example, the electrode 101 may include TiN and/or TaN. The electrode 101 may be considered as a part of the magnetic tunneling junction device 100 or as a part of a memory device including the magnetic tunneling junction device 100.

The pinned layer 120 and the free layer 140 may include a ferromagnetic metal material having magnetism. For example, the pinned layer 120 and the free layer 140 may include the same or different materials, and may include independently or concurrently at least one ferromagnetic material selected from the group consisting of iron (Fe), cobalt (Co), nickel (Ni), manganese (Mn), a Fe-containing alloy, a Co-containing alloy, a Ni-containing alloy, a Mn-containing alloy or a Heusler alloy. The pinned layer 120 may have a pinned magnetization direction, and the free layer 140 may have a variable magnetization direction. The magnetic tunneling junction device 100 may have a relatively low resistance when the pinned layer 120 and the free layer 140 have the same, or parallel, magnetization direction, and a relatively high resistance when the magnetization directions are opposite, or antiparallel. This phenomenon is called tunneling magnetoresistance (TMR). The magnetic tunneling junction device 100 may be used in a memory device by applying this TMR phenomenon.

The pinned layer 120 and the free layer 140 may have high perpendicular magnetic anisotropy (PMA), in particular, interface perpendicular magnetic anisotropy (IPMA). For example, the perpendicular magnetic anisotropy energy of the pinned layer 120 and the free layer 140 may exceed out-of-plane demagnetization energy. In this case, the magnetic moments of the pinned layer 120 and the free layer 140 may be stabilized in a direction that is perpendicular to a layer direction. The magnetic tunneling junction device 100 may be applied to spin transfer torque-magnetic RAM (STT-MRAM) and/or spin-orbit coupling torque (SOT) MRAM.

The free layer 140 may have a low saturation magnetization (Ms) to improve an operating speed of the memory device using the magnetic tunneling junction device 100. Additionally or alternatively, the free layer 140 may be further doped with or have incorporated therein a non-magnetic metal element so as to reduce the saturation magnetization Ms of the free layer 140. For example, the free layer 140 may be doped with at least one non-magnetic metal from among calcium (Ca), scandium (Sc), yttrium (Y), magnesium (Mg), strontium (Sr), barium (Ba), zirconium (Zr), beryllium (Be), titanium (Ti), hafnium (Hf), vanadium (V), zinc (Zn), niobium (Nb), aluminum (Al), chromium (Cr), lithium (Li), cadmium (Cd), lead (Pb), indium (In), gallium (Ga), and tantalum (Ta). The non-magnetic metal doped into the free layer 140 may have an oxygen affinity higher than that of the ferromagnetic metal material of the free layer 150.

Alternatively or additionally, if necessary or desirable, the free layer 140 may have two or more multi-layer structures including a layer including only a ferromagnetic metal material and a layer doped with a non-magnetic metal. The material and structure of the free layer 140 may reduce or prevent diffusion of oxygen or metal elements in an interface with the tunnel barrier layer 130 which will be described below.

The tunnel barrier layer 130 may serve to provide a magnetic tunneling junction between the pinned layer 120 and the free layer 140. The tunnel barrier layer 130 may include crystalline metal oxide. For example, the tunnel barrier layer 130 may include one or more of MgO, $MgAl_2O_4$, or $MgTiO_x$, where $1 \le x \le 4$.

A crystal direction of a material used as the electrode 101 is mainly a (111) direction. Meanwhile, a crystal of a ferromagnetic metal material used in the pinned layer 120 disposed on the electrode 101 mainly has a hexagonal close-packed (HCP) structure in which a crystal direction is (0001) or a face centered cubic (FCC) structure. Accordingly, when the pinned layer 120 is directly formed on the electrode 101, the crystal direction of the electrode 101 and the crystal direction of the pinned layer 120 may collide with each other in a heat treatment process of crystallizing the pinned layer 120. As a result, a crystal texture of the electrode 101 may be partially transferred to the pinned layer 120, and thus a crystal quality of the pinned layer 120 may deteriorate. The seed layer 110 is disposed between the electrode 101 and the pinned layer 120 to prevent or reduce an amount of and/or an impact from deterioration of the crystallinity of the pinned layer 120.

The seed layer 110 may include an amorphous material in order to prevent or reduce an amount of and/or impact from the crystal structure of the electrode 101 from being transferred to the pinned layer 120. The seed layer 110 may also include a material on which a crystal of the HCP or FCC structure can grow. In addition, the seed layer 110 may include a material capable of being maintained in an amorphous state without being diffused into the pinned layer 120 in a heat treatment process of a relatively high temperature, for example, about 300° C. to about 500° C., or about 400° C. to about 500° C. To this end, the seed layer 110 may not include boron (B). When boron is included in the seed layer 110, the boron may diffuse into the pinned layer 120 at a temperature equal to or greater than about 400° C., and thus the crystallinity of the pinned layer 120 may deteriorate. Due to this, a TMR ratio and an exchange field (Hex) of the magnetic tunneling junction device 100 may deteriorate.

For example, the seed layer 110 may include at least one amorphous material selected from CoFeX and CoFeXTa. For example, the seed layer 110 may include a ternary material including Co, Fe, and X, or a quaternary material including Co, Fe, Ta, and X. Here, X may include, for example, at least one element selected from niobium (Nb), molybdenum (Mo), tungsten (W), chromium (Cr), zirconium (Zr), and hafnium (Hf). A ratio of element X in the seed layer 110 may be about 5 at % to about 50 at %. In addition, a thickness of the seed layer 110 may be about 5 Å to about 15 Å.

Figure 2:
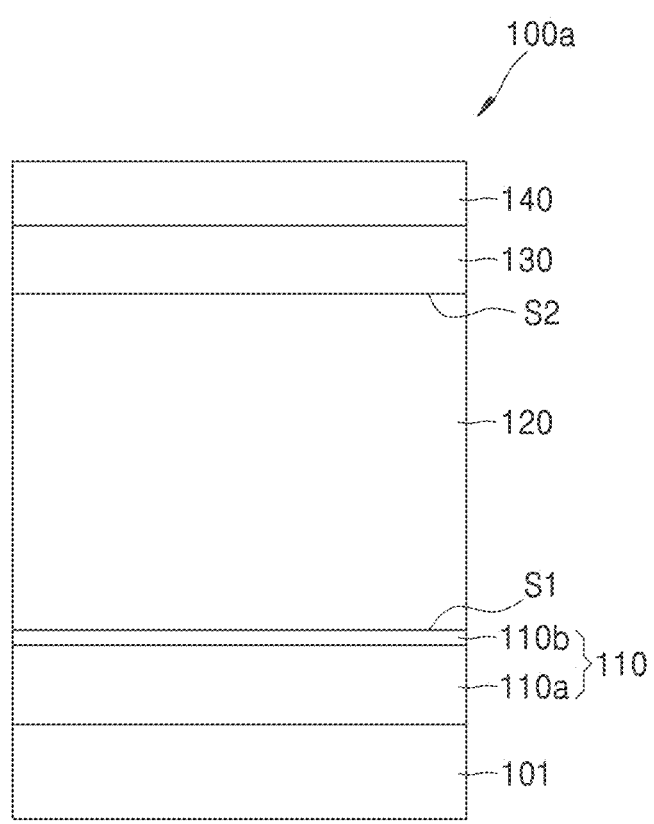
FIG. 2 is a cross-sectional view illustrating a schematic structure of a magnetic tunneling junction device according to some example embodiments.

FIG. 2 is a cross-sectional view illustrating a schematic structure of a magnetic tunneling junction device 100a according to some example embodiments. Referring to FIG. 2, the seed layer 110 of the magnetic tunneling junction device 100a may include a first seed layer 110a disposed on the electrode 101 and a second seed layer 110b disposed on the first seed layer 110a. The first seed layer 110a may be disposed to face the first surface S1 of the pinned layer 120, and the second seed layer 110b may be disposed between the first seed layer 110a and the pinned layer 120 to be in contact with the first seed layer 110a and the first surface S1 of the pinned layer 120. According to some example embodiments, the first seed layer 110a may include amorphous CoFeX and the second seed layer 110b may include tantalum (Ta). In other words, the first seed layer 110a may include a ternary material including Co, Fe, and X. In order to maintain the amorphous state in the heat treatment process of the relatively high temperature, the first seed layer 110a may not include boron (B). It may be seen that the first seed layer 110a and the second seed layer 110b are disposed on separate layers by separating CoFeX and Ta from among CoFeXTa which is the material of the seed layer 110 described with reference to FIG. 1. Meanwhile, the seed layer 110 of FIG. 1 including CoFeXTa may be a single layer.

Figure 3A:
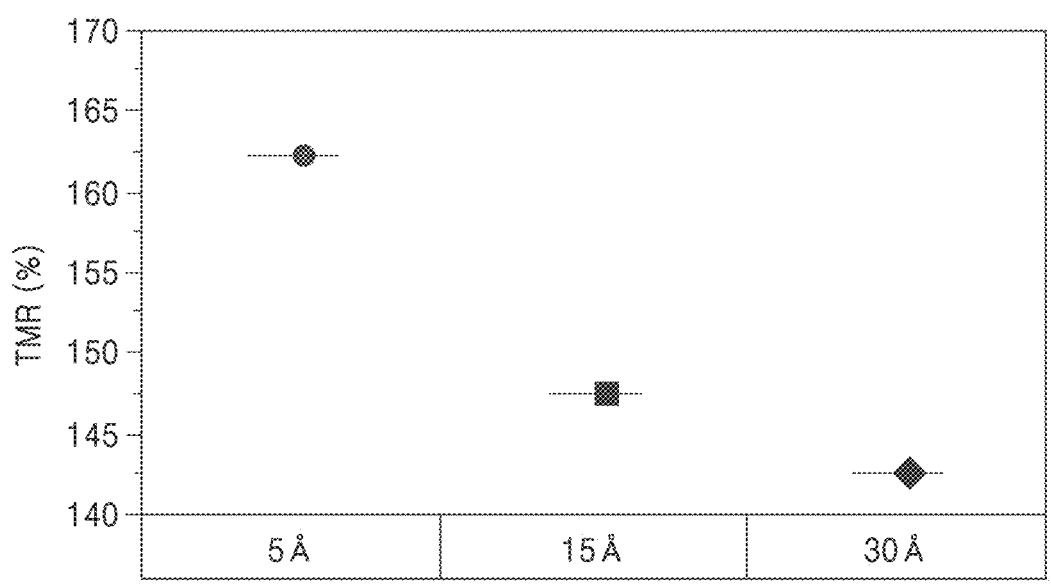
FIGS. 3A to 3C are graphs illustrating various characteristics of the magnetic tunneling junction device in FIG. 2 according to various thicknesses of a first seed layer.
Figure 3B:
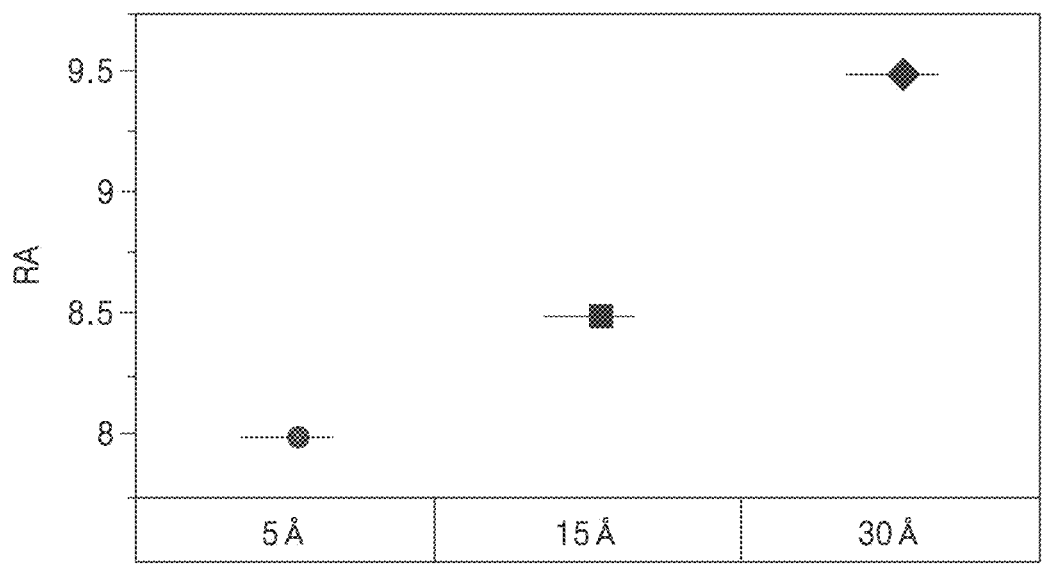
Figure 3C:
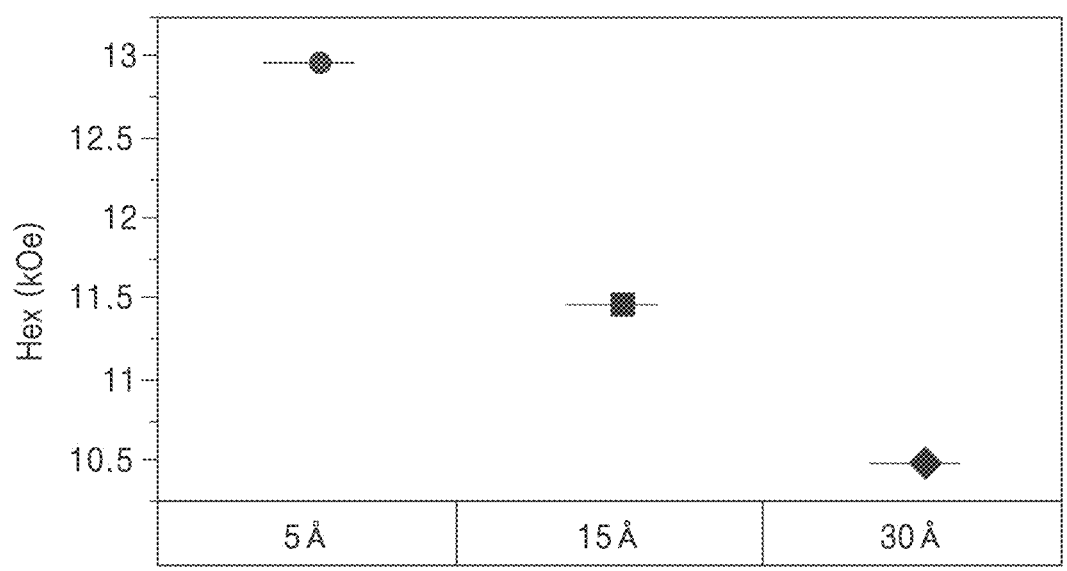

FIGS. 3A to 3C are graphs illustrating various characteristics of the magnetic tunneling junction device 100a in FIG. 2 according to various thicknesses of the first seed layer 110a. In particular, FIG. 3A is a graph illustrating a tunneling magnetoresistance (TMR) ratio, FIG. 3B is a graph illustrating a resistance-area product (RA), and FIG. 3C is a graph illustrating an exchange field (Hex). In an example embodiment, CoFeNb was used as a first seed layer and Ta was used as a second seed layer. Referring to FIGS. 3A to 3C, when the thickness of the first seed layer increases, the TMR ratio decreases, the resistance-area product (RA) increases, and the exchange field (Hex) decreases. Therefore, when the first seed layer 110a is too thick, properties of the magnetic tunneling junction device 100a may be degraded. For example, the thickness of the first seed layer 110a may be about 5 Å (0.5 nm) to about 20 Å (2 nm).

Figure 4A:
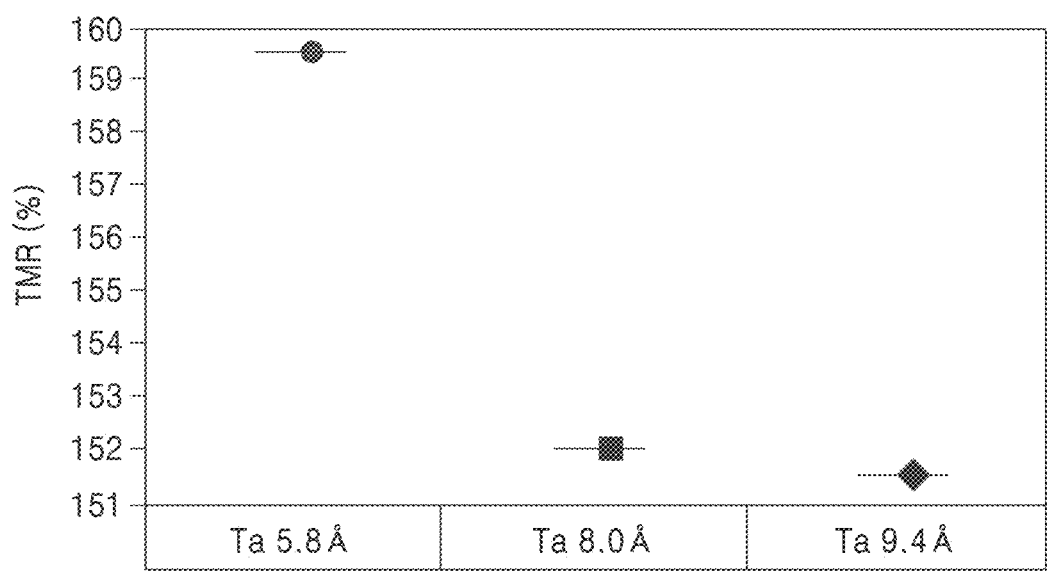
FIGS. 4A to 4C are graphs illustrating various characteristics of the magnetic tunneling junction device in FIG. 2 according to various thicknesses of a second seed layer.
Figure 4B:
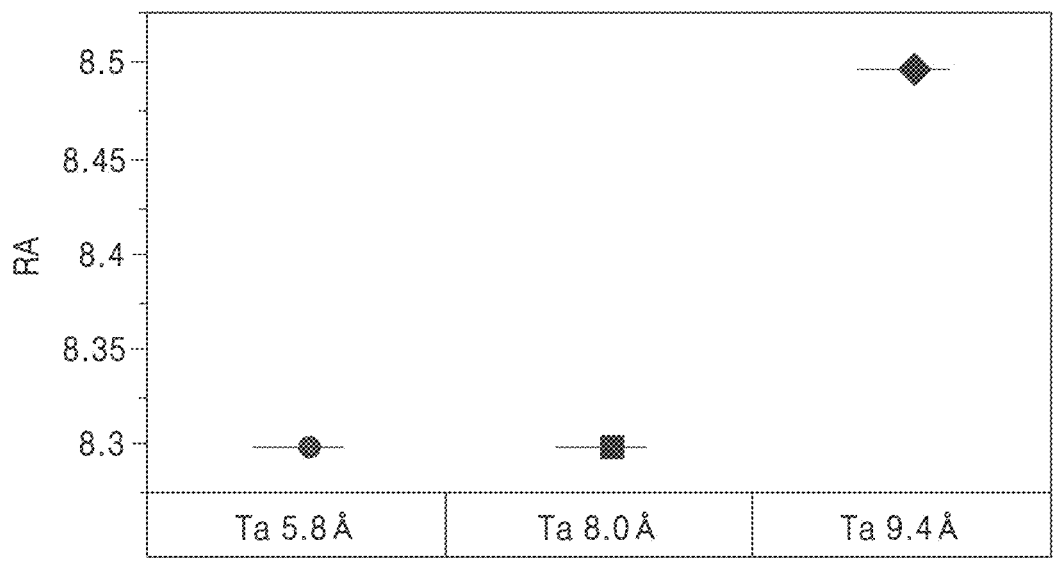
Figure 4C:
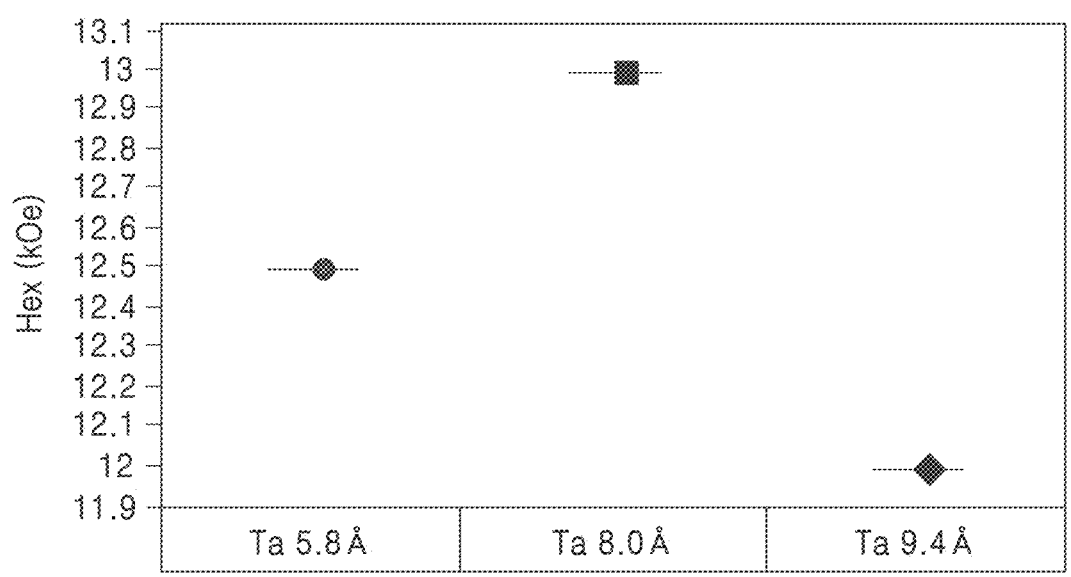

FIGS. 4A to 4C are graphs illustrating various characteristics of the magnetic tunneling junction device 100a in FIG. 2 according to thicknesses of the second seed layer 110b. In particular, FIG. 4A is a graph illustrating the TMR ratio, FIG. 4B is a graph illustrating the resistance-area product (RA), and FIG. 4C is a graph illustrating the exchange field (Hex). In an example embodiment, CoFeNb was used as a first seed layer and Ta was used as a second seed layer. Considering the graphs of FIGS. 4A to 4C, the thickness of the second seed layer 110b may be about 5 Å (0.5 nm) to about 10 Å (1 nm). A sum of the thickness of the first seed layer 110a and the thickness of the second seed layer 110b is about 10 Å (1 nm) to about 30 Å (3 nm). The thickness of the second seed layer 110b may be smaller than the thickness of the first seed layer 110a.

Figure 5A:
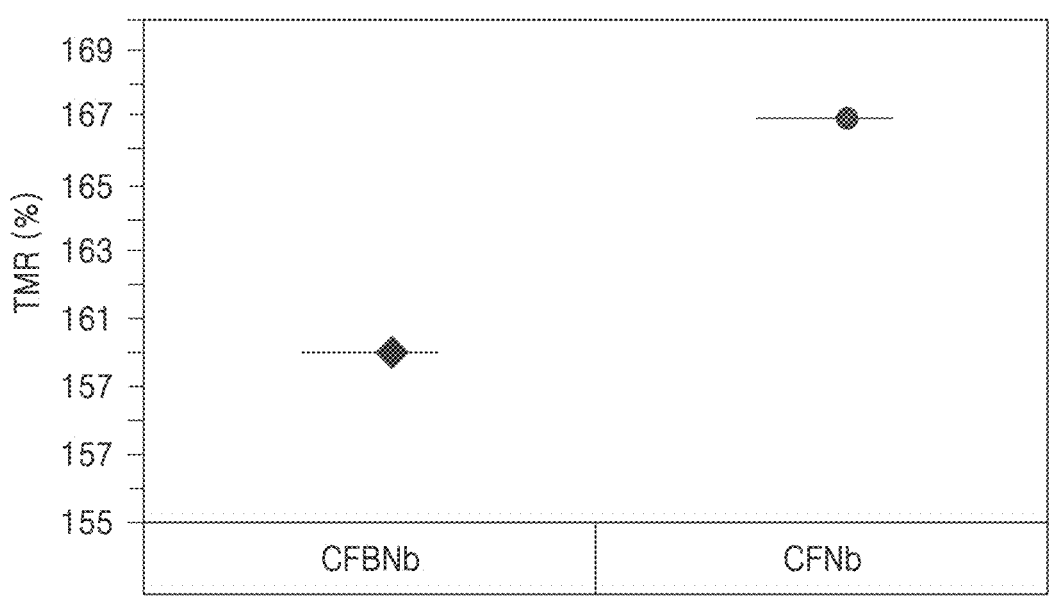
FIGS. 5A to 5C are graphs illustrating various characteristics of a magnetic tunneling junction device according to an example embodiment compared with a comparative example.
Figure 5B:
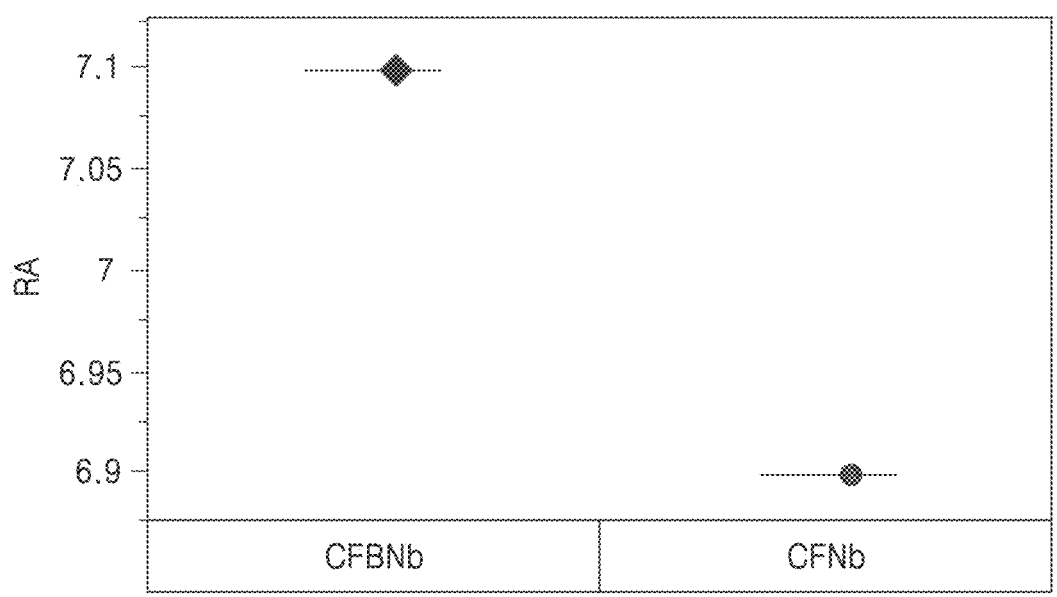
Figure 5C:
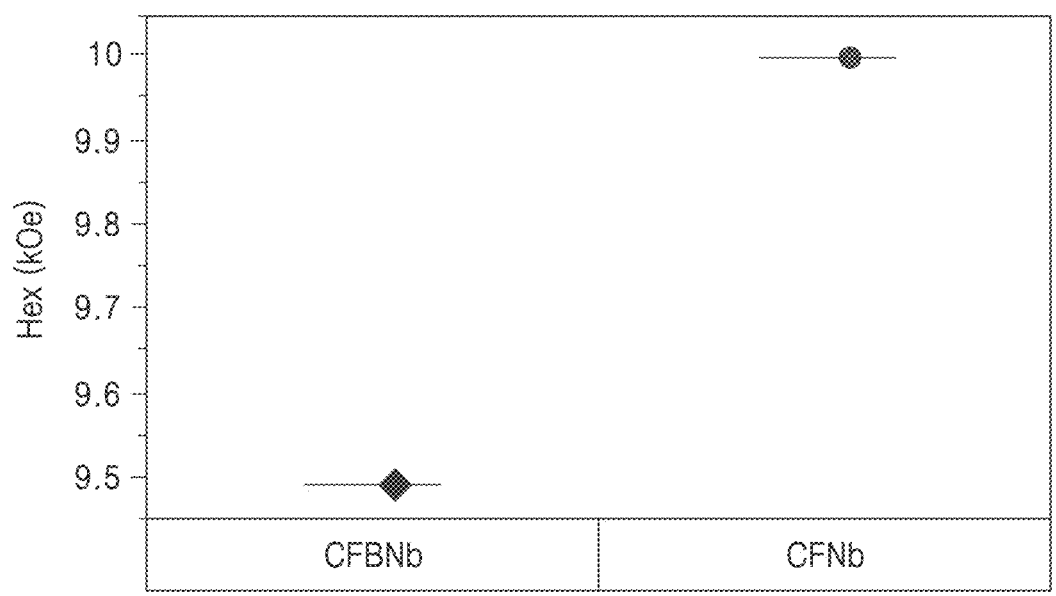

FIGS. 5A to 5C are graphs illustrating various characteristics of a magnetic tunneling junction device according to an example embodiment compared with a comparative example. In particular, FIG. 5A is a graph illustrating the TMR ratio, FIG. 5B is a graph illustrating the resistance-area product (RA), and FIG. 5C is a graph illustrating the exchange field (Hex). In the example embodiment, CoFeNb was used as a first seed layer and Ta was used as a second seed layer. In the comparative example, CoFeBNb was used as a first seed layer and Ta was used as a second seed layer. Referring to FIGS. 5A to 5C, the example embodiment has a higher TMR ratio, a lower resistance-area product (RA), and a higher exchange field (Hex) in comparison with the comparative example including boron in the first seed layer.

Figure 6A:
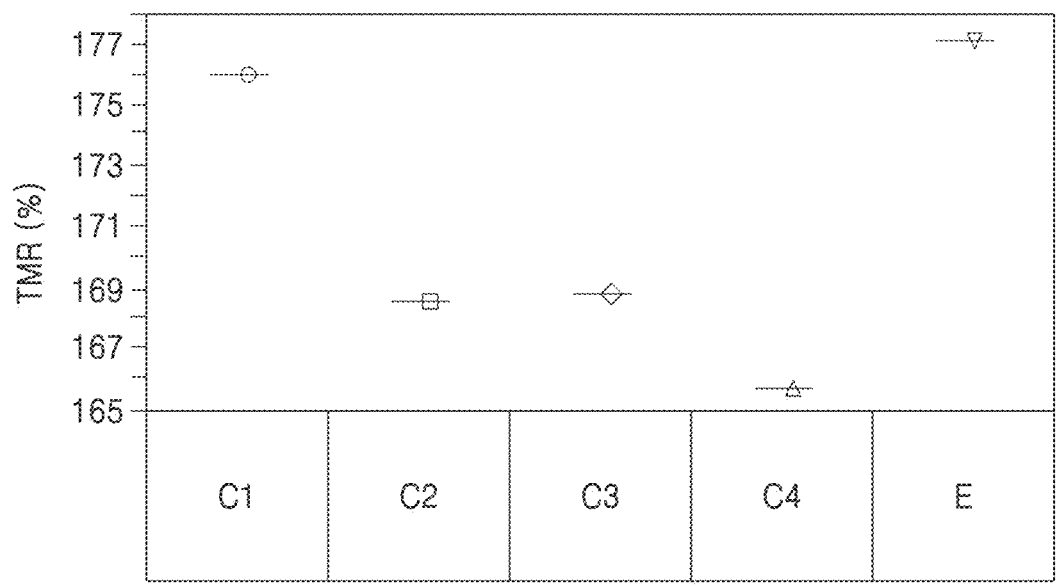
FIGS. 6A to 6C are graphs illustrating various characteristics of a magnetic tunneling junction device according to an example embodiment compared with some comparative examples.
Figure 6B:
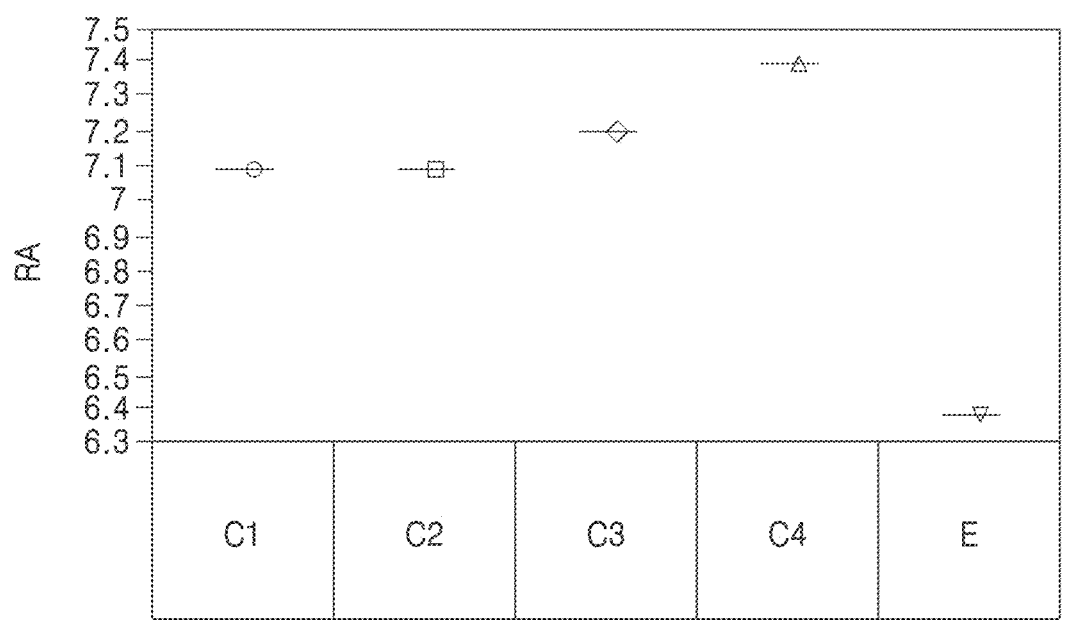
Figure 6C:
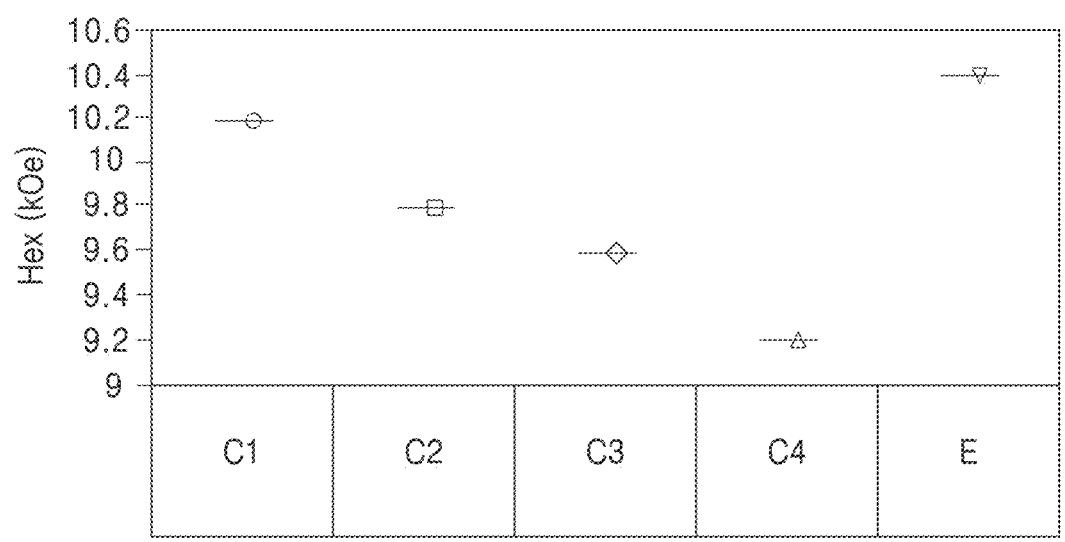

FIGS. 6A to 6C are graphs illustrating various characteristics of a magnetic tunneling junction device according to an example embodiment compared with some comparative examples. In particular, FIG. 6A is a graph illustrating the TMR ratio, FIG. 6B is a graph illustrating the resistance-area product (RA), and FIG. 6C is a graph illustrating the exchange field (Hex). In a first comparative example C1, a first seed layer was not doped with non-magnetic metal. For example, CoFe was used as the first seed layer and Ta was used as a second seed layer. In second to fourth comparative examples C2 to C4, CoFeBNb was used as a first seed layer and Ta was used as a second seed layer. A concentration of boron in the first free layer is 14 at %, 20 at %, and 30 at % in the second to fourth comparative examples C2 to C4, respectively. In the example embodiment E, CoFeNb was used as a first seed layer and Ta was used as a second seed layer. Referring to FIGS. 6A to 6C, when the concentration of boron in the first free layer increases, the TMR ratio decreases, the resistance-area product (RA) increases, and the exchange field (Hex) decreases. In addition, the example embodiment E has the highest TMR ratio, the lowest resistance-area product (RA), and the highest exchange field (Hex) in comparison with the comparative examples C1 to C4.

Meanwhile, the pinned layer 120 has one of an HCP structure or an FCC structure, while the tunnel barrier layer 130 and the free layer 140 thereon have a body centered cubic (BCC) structure. Accordingly, when the tunnel barrier layer 130 and the free layer 140 are directly formed on the pinned layer 120, because different crystal structures collide with each other, the crystal quality of the tunnel barrier layer 130 and the free layer 140 may deteriorate. In order to prevent or reduce an amount of and/or impact from deterioration of crystallinity of the tunnel barrier layer 130 and the free layer 140, additional layers may be further disposed between the pinned layer 120 and the tunnel barrier layer 130.

Figure 7:
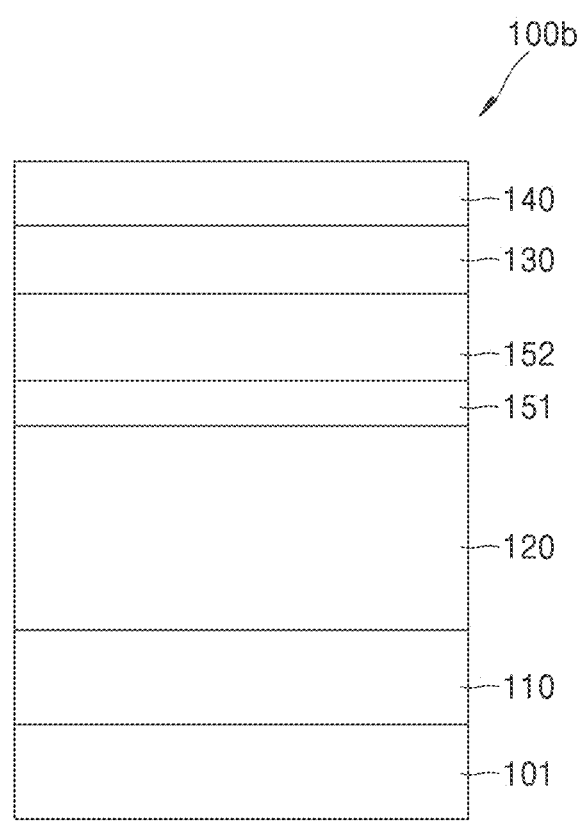
FIG. 7 is a cross-sectional view illustrating a schematic structure of a magnetic tunneling junction device according to some example embodiments.

FIG. 7 is a cross-sectional view showing a schematic structure of a magnetic tunneling junction device 100b according to some example embodiments. Referring to FIG. 7, the magnetic tunneling junction device 100b may further include an anti-crystallized layer 151 disposed between the pinned layer 120 and the tunnel barrier layer 130. Alternatively or additionally, the magnetic tunneling junction device 100b may further include a polarization enhancing layer 152 disposed between the anti-crystallized layer 151 and the tunnel barrier layer 130. In this case, the pinned layer 120, the anti-crystallized layer 151, the polarization enhancing layer 152, the tunnel barrier layer 130, and the free layer 140 may be sequentially formed on an upper surface of the seed layer 110.

The anti-crystallized layer 151 may prevent or reduce an amount of and/or impact from a crystal structure of the pinned layer 120 from being transferred to the tunnel barrier layer 130 and the free layer 140, and may serve to help the pinned layer 120 on a lower portion and the tunnel barrier layer 130 and the free layer 140 on an upper portion to have their intrinsic crystallinity. For example, the anti-crystallized layer 151 may be referred to as a texture blocking layer. It may be advantageous that the anti-crystallized layer 151 uses a material that is or is maintained in an amorphous state even during heat treatment at a relatively high temperature and does not or minimally diffuses into surrounding layers. For example, the anti-crystallized layer 151 may include a material capable of being maintained in the amorphous state without diffusing to surrounding layers in a heat treatment process of a relatively high temperature about 300° C. to about 500° C., or about 400° C. to about 500° C. To this end, the anti-crystallized layer 151 may include at least one of YCo, YFe, YCoFe, YCoB, YFeB, or YCoFeB. Here, Y may include, for example, at least one element selected from tungsten (W), rhenium (Re), molybdenum (Mo), and tantalum (Ta). When the anti-crystallized layer 151 includes YFeB, a ratio of FeB in the anti-crystallized layer 151 may be about 20 at % to about 60 at %, and a ratio of boron (B) in FeB may be about 10 at % to about 30 at %. A thickness of the anti-crystallized layer 151 may be about 1.5 Å to about 10 Å.

The polarization enhancing layer 152 may serve to assist growth of the tunnel barrier layer 130 and the free layer 140 on the anti-crystallized layer 151. Alternatively or additionally, the polarization enhancing layer 152 may have a crystal structure similar to that of the tunnel barrier layer 130 or the free layer 140, and may further improve the crystal quality of the tunnel barrier layer 130 and the free layer 140 formed on the anti-crystallized layer 151. To this end, the polarization enhancing layer 152 may include a ferromagnetic material similar to that of the free layer 140. For example, the polarization enhancing layer 152 may include at least one of iron (Fe), cobalt (Co), nickel (Ni), manganese (Mn), an Fe-containing alloy, a Co-containing alloy, a Ni-containing alloy, a Mn-containing alloy or a Heusler alloy. The polarization enhancing layer 152 may further include boron. For example, the polarization enhancing layer 152 may include CoFeB. A thickness of the polarization enhancing layer 152 may be about 5 Å to about 10 Å.

Figure 8:
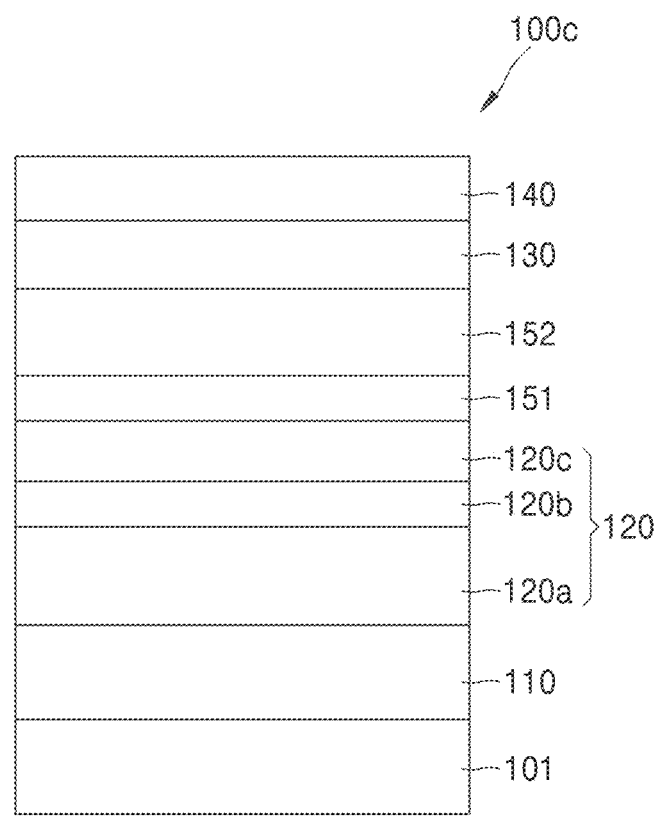
FIG. 8 is a cross-sectional view illustrating a schematic structure of a magnetic tunneling junction device according to some example embodiments.

FIG. 8 is a cross-sectional view showing a schematic structure of a magnetic tunneling junction device 100c according to some example embodiments. Referring to FIG. 8, the pinned layer 120 of the magnetic tunneling junction device 100c may include synthetic antiferromagnet (SAF). The pinned layer 120 may include, for example, a first ferromagnetic layer 120a in contact with the seed layer 110, a second ferromagnetic layer 120c in contact with the anti-crystallized layer 151, and a SAF coupling layer 120b disposed between the first ferromagnetic layer 120a and the second ferromagnetic layer 120c. In this case, the first ferromagnetic layer 120a, the SAF coupling layer 120b, the second ferromagnetic layer 120c, the anti-crystallized layer 151, the polarization enhancing layer 152, the tunnel barrier layer 130, and the free layer 140 may be sequentially formed on an upper surface of the seed layer 110.

The SAF coupling layer 120b may include a conductive metal. For example, the SAF coupling layer 120b may include at least one of iridium (Ir), ruthenium (Ru), aluminum (Al), copper (Cu), silver (Ag), or an alloy including the same. Each of the first ferromagnetic layer 120a and the second ferromagnetic layer 120c may independently or concurrently have a single layer structure including a ferromagnetic metal and/or an alloy of a ferromagnetic metal and a transition metal, or may have a multilayer structure including a plurality of layers including a ferromagnetic metal or an alloy of a ferromagnetic metal and a transition metal. For example, each of the first ferromagnetic layer 120a and the second ferromagnetic layer 120c may include a single layer structure or a multilayer structure including Co, Fe, CoPt, FePt, CoFe, etc.

In such a structure of the pinned layer 120, the first ferromagnetic layer 120a and the second ferromagnetic layer 120c may form an antiferromagnet by means of the SAF coupling layer 120b by the Ruderman-Kittel-Kasuya-Yosida (RKKY) interaction. For example, the pinned layer 120 may have a stable state when a magnetization direction of the first ferromagnetic layer 120a and a magnetization direction of the second ferromagnetic layer 120c are opposite to each other. For example, the first ferromagnetic layer 120a may be magnetized toward a lower surface and the second ferromagnetic layer 120c may be magnetized toward an upper surface, or the first ferromagnetic layer 120a may be magnetized toward an upper surface and the second ferromagnetic layer 120c may be magnetized toward a lower surface. The first ferromagnetic layer 120a and the second ferromagnetic layer 120c magnetized in opposite directions (or antiparallel with each other) may offset stray magnetic fields from each other. Therefore, the first ferromagnetic layer 120a and the second ferromagnetic layer 120c magnetized in opposite directions to each other may be used, thereby reducing or preventing the stray magnetic field generated in the pinned layer 120 from affecting the free layer 140.

Figure 9:
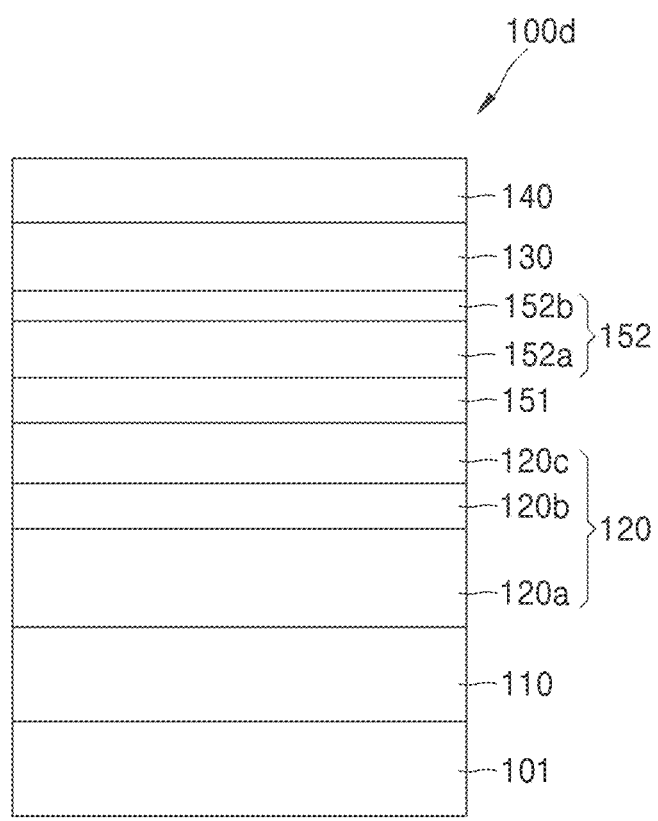
FIG. 9 is a cross-sectional view illustrating a schematic structure of a magnetic tunneling junction device according to some example embodiments.

FIG. 9 is a cross-sectional view showing a schematic structure of a magnetic tunneling junction device 100d according to some example embodiments. Referring to FIG.

9, the polarization enhancing layer 152 of the magnetic tunneling junction device 100d may include a first polarization enhancing layer 152a in contact with the anti-crystallized layer 151 and a second polarization enhancing layer 152b disposed between the first polarization enhancing layer 152a and the tunnel barrier layer 130. In this case, the first ferromagnetic layer 120a, the SAF coupling layer 120b, the second ferromagnetic layer 120c, the anti-crystallized layer 151, the first polarization enhancing layer 152a, the second polarization enhancing layer 152b, the tunnel barrier layer 130, and the free layer 140 may be sequentially formed on an upper surface of the seed layer 110.

The first polarization enhancing layer 152a and the second polarization enhancing layer 152b may include the same material but may have different composition ratios. The first polarization enhancing layer 152a and the second polarization enhancing layer 152b may include, for example, CoFeB. A ratio of boron (B) in the second polarization enhancing layer 152b may be less than a ratio of boron (B) in the first polarization enhancing layer 152a. For example, the ratio of boron (B) in the first polarization enhancing layer 152a may be about 25 at % to about 35 at %, and the ratio of boron (B) in the second polarization enhancing layer 152b may be about 15 at % to about 25 at %. Alternatively or additionally, a thickness of the second polarization enhancing layer 152b may be less than a thickness of the first polarization enhancing layer 152a. For example, the thickness of the first polarization enhancing layer 152a may be about 5 Å to about 7 Å, and the thickness of the second polarization enhancing layer 152b may be about 1 Å to about 3 Å. A crystal structure may be easily changed from the pinned layer 120 to the free layer 140 through a gradual change in the composition ratio in the polarization enhancing layer 152. Accordingly, the crystal quality of the tunnel barrier layer 130 and the free layer 140 may be further improved.

As described above, a material of the seed layer 110 may be a material that is or is maintained in an amorphous state during a heat treatment process of a relatively high temperature, and may not diffuse or may diffuse relatively little into surrounding layers. In addition, the anti-crystallized layer 151 may also be maintained in an amorphous state during a heat treatment process of a relatively high temperature, and may not diffuse or may diffuse relatively little into surrounding layers. Therefore, the magnetic tunneling junction device according to some example embodiments may have a high temperature resistance, and thus a heat treatment may be performed at a relatively high temperature when the magnetic tunneling junction device according to some example embodiments is manufactured, and subsequent processes after the heat treatment may also be performed at a relatively high temperature. Accordingly, the crystal quality of magnetic materials in the pinned layer 120 and the free layer 140 may be improved. As a result, the magnetic tunneling junction device according to the embodiments may have a relatively high TMR ratio and/or a relatively high exchange field (Hex).

Figure 10:
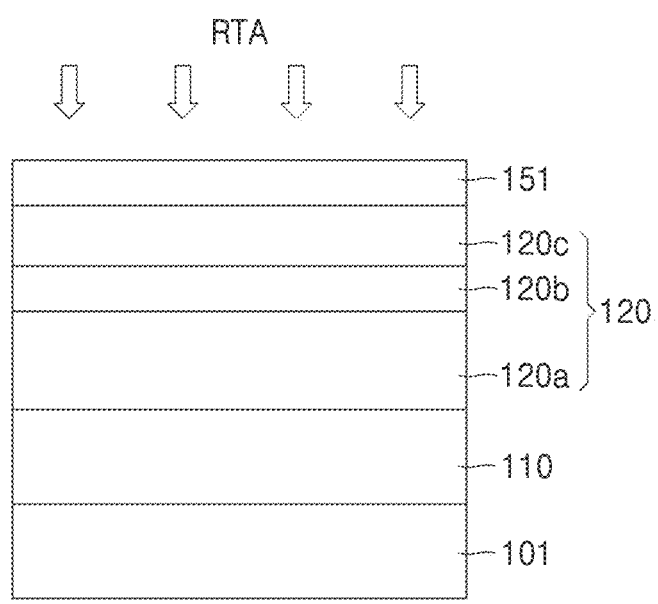
FIG. 10 is a cross-sectional view illustrating part of a process of manufacturing a magnetic tunneling junction device.

FIG. 10 is a cross-sectional view illustrating a part of a manufacturing process of a magnetic tunneling junction device. Referring to FIG. 10, the seed layer 110 may be formed on the electrode 101, the pinned layer 120 and the anti-crystallized layer 151 may be sequentially formed on the seed layer 110, and then the pinned layer 120 may be first crystallized through a heat treatment process. The seed layer 110 may be formed by depositing the first seed layer 110a on the electrode 101 and depositing the second seed layer 110b on the first seed layer 110a, as shown in FIG. 2. The pinned layer 120 may be formed by sequentially depositing the first ferromagnetic layer 120a, the SAF coupling layer 120b, and the second ferromagnetic layer 120c on the seed layer 110. The heat treatment may be performed through rapid thermal annealing (RTA), for example, from about 300° C. to about 500° C., from about 300° C. to about 450° C., from about 350° C. to about 450° C., or from about 450° C. to about 500° C. The RTA may be performed for about 10 seconds to about 200 seconds.

Thereafter, the polarization enhancing layer 152 shown in FIG. 7 may be formed on the anti-crystallized layer 151, and the tunnel barrier layer 130 and the free layer 140 may be deposited on the polarization enhancing layer 152. Alternatively, the polarization enhancing layer 152 may be formed by depositing the first polarization enhancing layer 152a on the anti-crystallized layer 151 and the second polarization enhancing layer 152b on the first polarization enhancing layer 152a, as shown in FIG. 9. After depositing the free layer 140, the tunnel barrier layer 130 and the free layer 140 may be crystallized through a heat treatment again. The heat treatment may be performed through an additional RTA, for example, from about 300° C. to about 500° C., from about 300° C. to about 450° C., from about 350° C. to about 450° C., or from about 450° C. to about 500° C. The additional RTA may be performed for about 100 seconds to about 400 seconds. Through this process, the crystal quality of the pinned layer 120 may be further improved.

Figure 11:
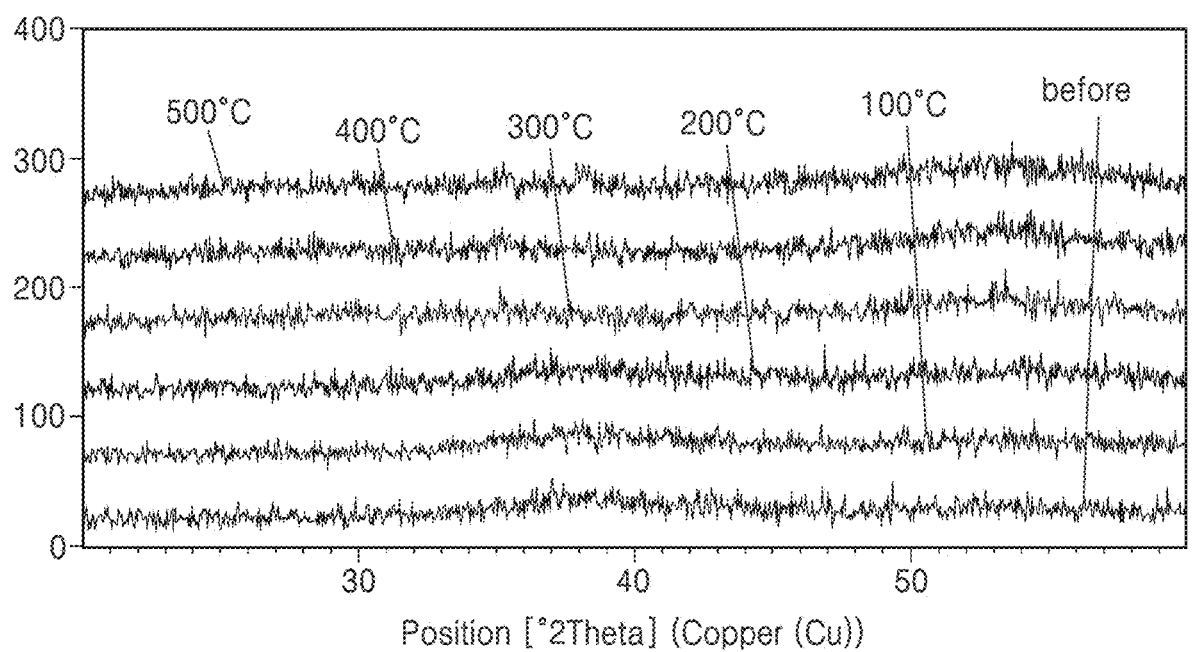
FIG. 11 is a graph illustrating results of X-ray diffraction (XRD) analysis of a seed layer.

FIG. 11 is a graph illustrating results of X-ray diffraction (XRD) analysis of the first seed layer 110a. FIG. 11 illustrates the XRD analysis results with respect to CoFeNb before a heat treatment and after the heat treatment at 100° C., 200° C., 300° C., 400° C., and 500° C. Referring to FIG. 11, it may be seen that an amorphous state of CoFeNb in the first seed layer 110a is maintained even after the heat treatment at 500° C.

In addition, based on an atomic force microscopy (AFM) analysis, a surface roughness of the first seed layer 110a after the heat treatment at 500° C. was improved to 0.093 nm. Accordingly, the seed layer 110 may have the surface roughness equal to or less than 0.1 nm. A surface roughness of a seed layer according to a comparative example including TaB after the heat treatment at 350° C. was 0.104 nm.

Figure 12:
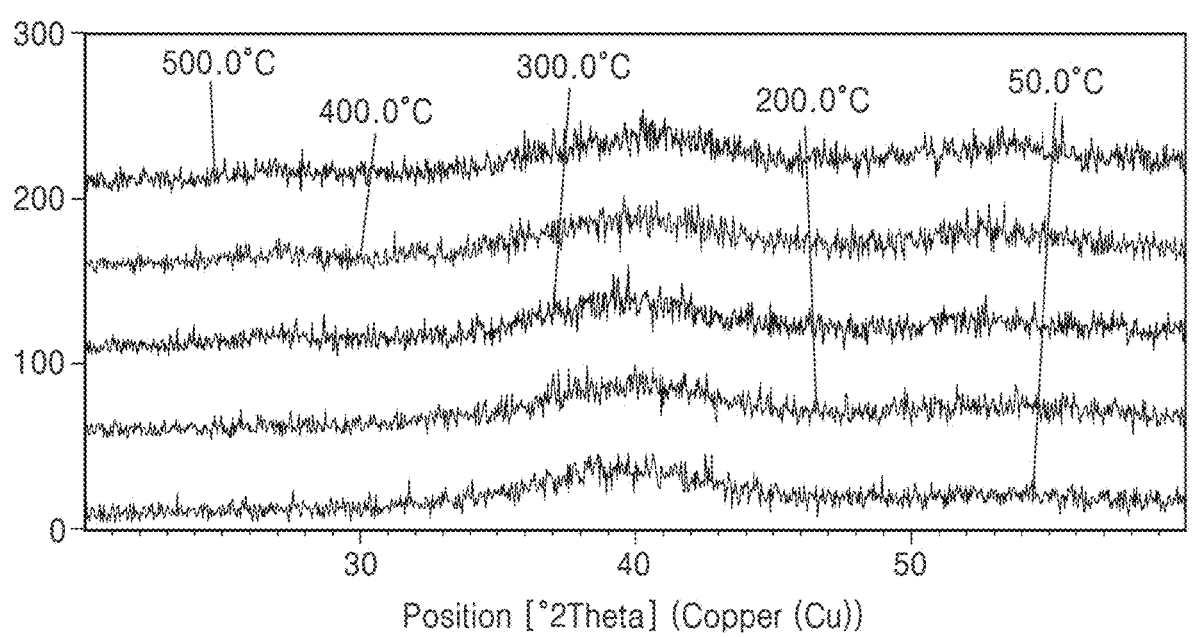
FIG. 12 is a graph illustrating results of XRD analysis of an anti-crystalized layer.

FIG. 12 is a graph illustrating results of XRD analysis of the anti-crystallized layer 151. FIG. 12 illustrates the XRD analysis results with respect to WFeB after the heat treatment at 50° C., 200° C., 300° C., 400° C., and 500° C. Referring to FIG. 12, it may be seen that an amorphous state of WFeB is maintained even after the heat treatment at 500° C.

According to an AFM analysis, it was confirmed that the crystallinity of the pinned layer 120 may be improved through the heat treatment process shown in FIG. 10, and thus a surface roughness of the pinned layer 120 was slightly improved from 0.138 nm before the heat treatment to 0.135 nm after the heat treatment.

Figure 13:
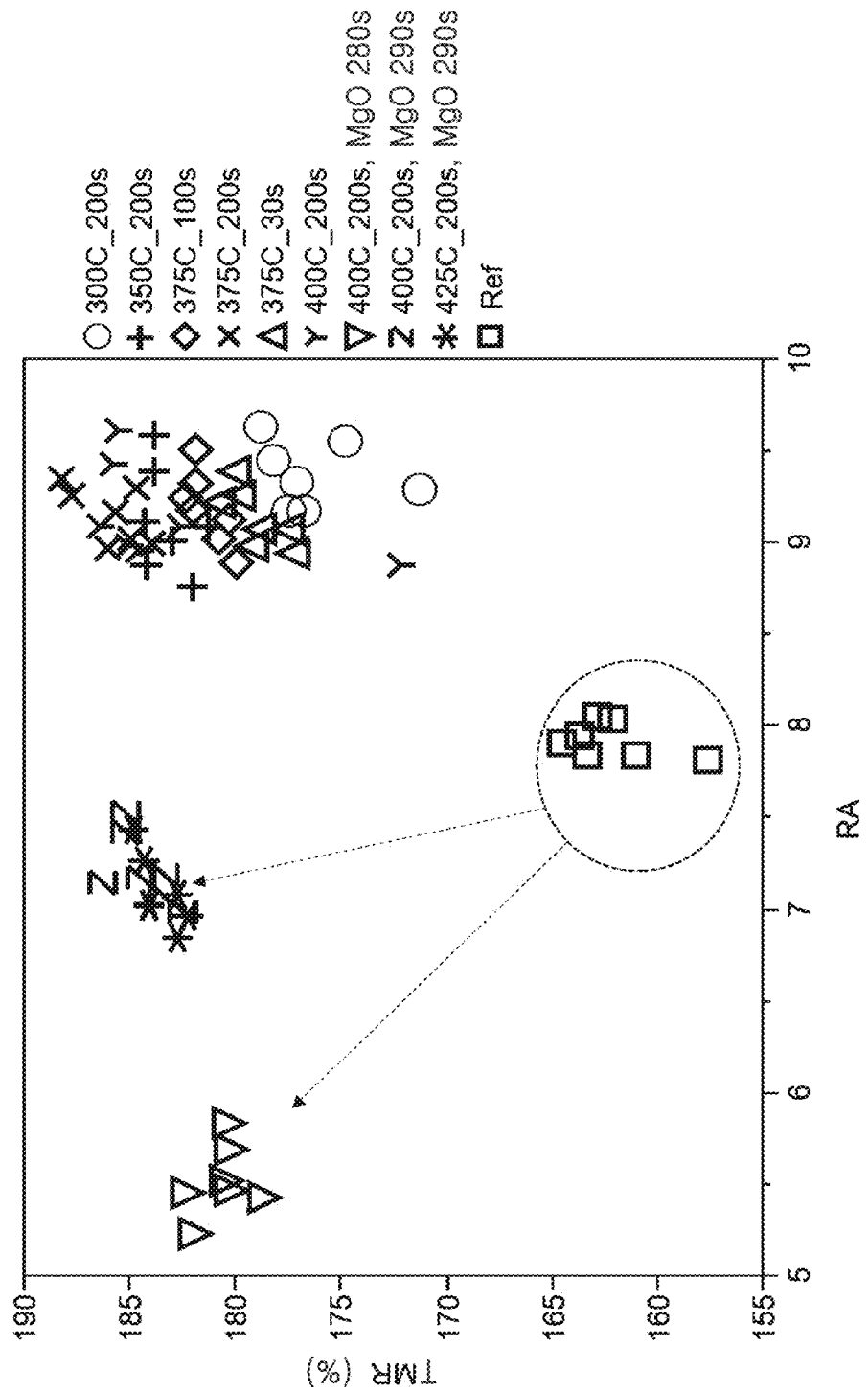
FIG. 13 is a graph illustrating a resistance-area product (RA) and a tunneling magnetoresistance (TMR) ratio of magnetic tunneling junction devices according to various manufacturing process conditions.

FIG. 13 is a graph illustrating a resistance-area product (RA) and a TMR ratio of magnetic tunneling junction devices according to various manufacturing process conditions. In FIG. 13, "Ref" represents a resistance-area product and a TMR ratio of a comparative example. In some example embodiments, CoFeNb was used as a first seed layer, Ta was used as a second seed layer, and WFeB was used as an anti-crystallized layer. In the comparative example, TaB containing boron was used as a seed layer, and only W was used alone as an anti-crystallized layer. In the comparative example, a heat treatment was performed at a temperature of 300° C. In addition, in a structure according to some example embodiments, a heat treatment was performed for 200 seconds at a temperature of 300° C., 200 seconds at a temperature of 350° C., 30 seconds at a temperature of 375° C., 100 seconds at a temperature of 375° C., 200 seconds at a temperature of 375° C., 200 seconds at a temperature of 400° C., and 200 seconds at a temperature of 425° C. In FIG. 13, "MgO 280 s" means that MgO is used as a material of the tunnel barrier layer 130 and is deposited for 280 seconds, and "MgO 290 s" means that MgO is deposited for 290 seconds. In FIG. 13, in all examples in which "MgO 280 s" or "MgO 290 s" is not indicated, MgO is deposited for 300 seconds. In addition, the resistance-area product and the TMR ratio of each of seven magnetic tunneling junction devices including pinned layers having different thicknesses were measured in the comparative example and the embodiments. The TMR ratio is a ratio of a low resistance to a high resistance of the magnetic tunneling junction device, and may be expressed as "(high resistance-low resistance)/low resistance".

Referring to FIG. 13, in various example embodiments, a high TMR ratio was achieved compared to the comparative example under all heat treatment conditions. For example, in the embodiments, the TMO ratio was about 170% to about 190% and was increased as a heat treatment temperature increases and a heat treatment time increases. In addition, when a deposition time of MgO is reduced to 280 seconds or 290 seconds, the resistance-area product equal to or less than 8 Ω μm$^2$ (Ohms per square micron) was achieved. For example, when the deposition time of MgO is reduced to 280 seconds or 290 seconds, an average resistance-area product in each of the embodiments was about 5.4 to about 7.1, and an average TMO ratio was about 178% to 184% in each of the embodiments in which the deposition time of MgO is reduced to 280 seconds or 290 seconds.

Figure 14:
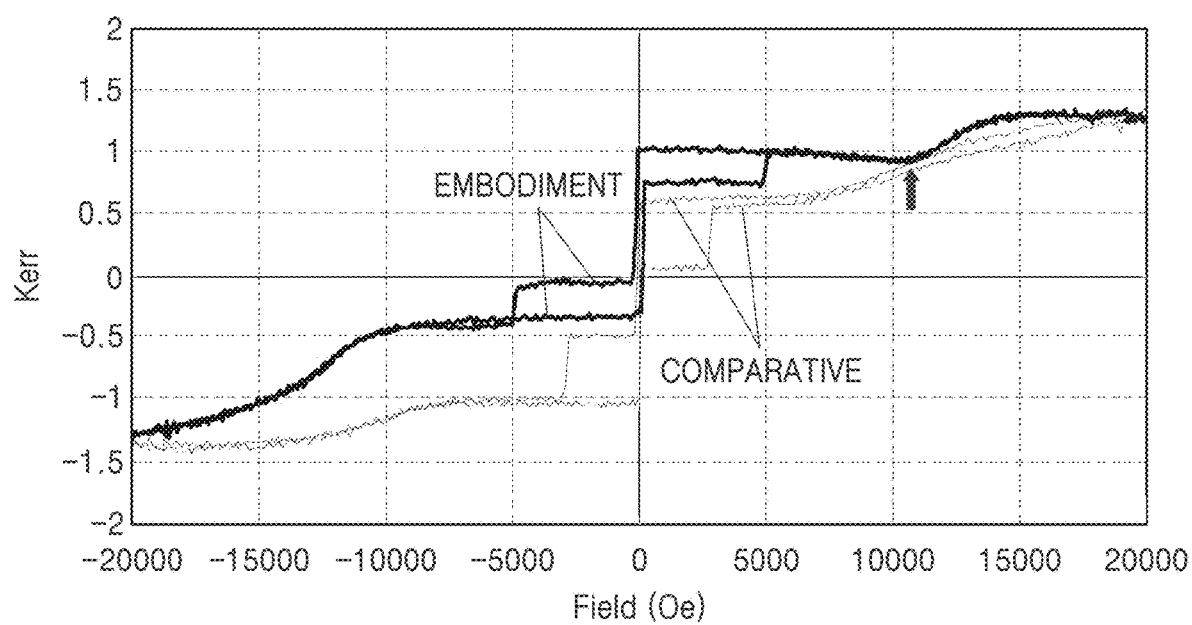
FIG. 14 is a graph illustrating a Kerr rotation angle with respect to an external magnetic field in a magnetic tunneling junction device according to some example embodiments compared with a comparative example.

FIG. 14 is a graph illustrating a Kerr rotation angle with respect to an external magnetic field in a magnetic tunneling junction device according to some example embodiments compared with a comparative example. Referring to FIG. 14, CoFeNb was used as a first seed layer, Ta was used as a second seed layer, and WFeB was used as an anti-crystallized layer in some example embodiments. In the comparative example, TaB containing boron was used as a seed layer, and only W was used alone as an anti-crystallized layer. In addition, in embodiments, a heat treatment was performed at a temperature of 400° C., and in the comparative example, the heat treatment was performed at a temperature of 300° C. Referring to FIG. 14, in the comparative example, deterioration of a pinned layer started at about 5000 Oe (Oersted). For example, when intensity of the external magnetic field is equal to or greater than about 5000 Oe, a magnetization direction of a first ferromagnetic layer and a magnetization direction of the second ferromagnetic layer of the pinned layer are the same as a direction of the external magnetic field, and properties of an antiferromagnet are lost. Meanwhile, in embodiments, the pinned layer maintains the properties of the antiferromagnet up to about 11000 Oe, as indicated by an arrow in FIG. 10, and when the intensity of the external magnetic field is equal to or greater than about 11000 Oe, the magnetization direction of the first ferromagnetic layer and the magnetization direction of the second ferromagnetic layer of the pinned layer are the same. Therefore, it may be confirmed that the magnetic tunneling junction device according to example embodiments has a higher exchange field (Hex) and a higher stability compared with the comparative example.

Figure 15:
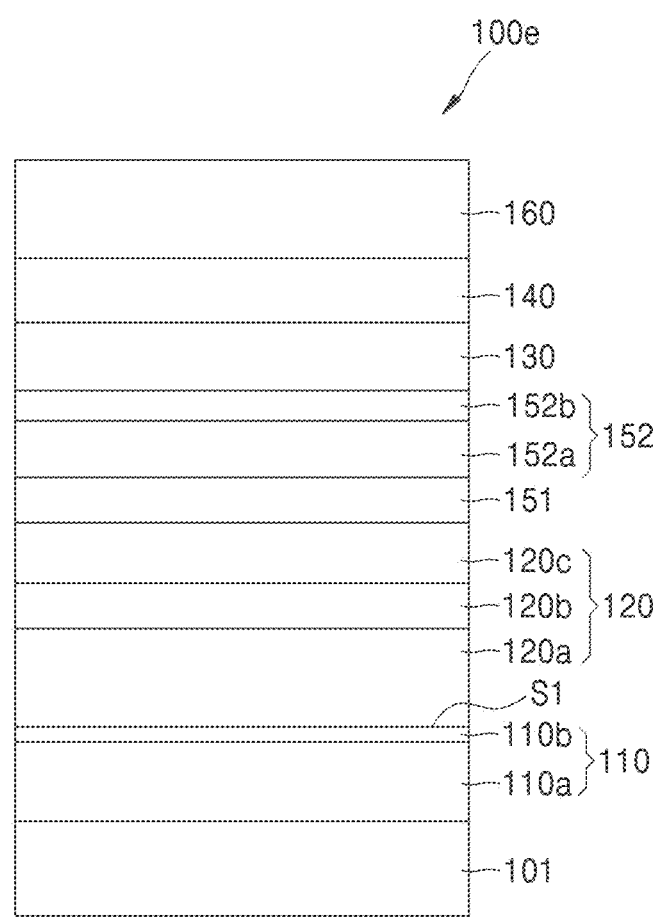
FIG. 15 is a cross-sectional view illustrating a schematic structure of a magnetic tunneling junction device according to some example embodiments.

FIG. 15 is a cross-sectional view showing a schematic structure of a magnetic tunneling junction device 100e according to some example embodiments. Referring to FIG. 15, the magnetic tunneling junction device 100e may further include an oxide layer 160 disposed on the free layer 140. In some example embodiments, the oxide layer 160 may serve as a capping layer. In this case, the oxide layer 160 usually includes the same material as that of the tunnel barrier layer 130, but is not necessarily limited thereto and may include any oxide material. Meanwhile, in some example embodiments, the oxide layer 160 may include an oxide material that directly contacts an upper surface of the free layer 140 and has absorptivity to boron in order to absorb boron in the free layer 140. For example, the oxide layer 160 may include at least one oxide material selected from the group consisting of or including HfOx, NbOx, TaOx, and WOx. The oxide layer 160 may absorb boron in the free layer 140, and thus a concentration of boron in the free layer 140 may be reduced. Boron is usually included in the free layer 140 in order to easily form the free layer 140 on the tunnel barrier layer 130. However, boron may increase saturation magnetization and decrease the switching efficiency of the free layer 140. When the oxide layer 160 absorbs boron in the free layer 140, the saturation magnetization of the free layer 140 may decrease. Then, a saturation magnetization of the free layer 140 may be reduced, and thus an operation speed of the magnetic tunneling junction device 100e may be improved.

Figure 16:
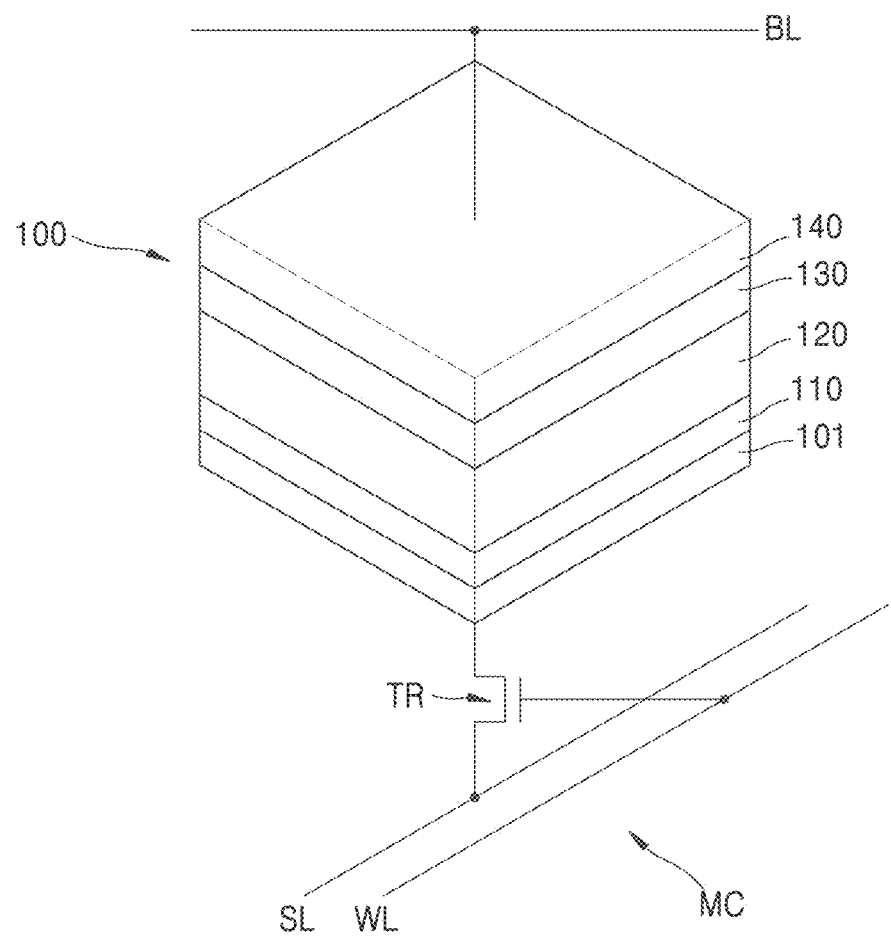
FIG. 16 schematically illustrates one memory cell including a magnetic tunneling junction device according to some example embodiments.

FIG. 16 schematically illustrates one memory cell including the magnetic tunneling junction device 100 according to some example embodiments. Referring to FIG. 16, the memory cell MC may include the above-described magnetic tunneling junction device 100 and a switching device TR connected to the magnetic tunneling junction device 100. The switching device TR may be or may include a transistor such as a thin film transistor. The memory cell MC may be connected between a bit line BL and a word line WL. The bit line BL and the word line WL may be disposed to cross each other (e.g. to be perpendicular to each other), and the memory cell MC may be disposed in or at an intersection point of the bit line BL and the word line WL. The bit line BL may be electrically connected to the free layer 140 of the magnetic tunneling junction device 100 and the word line WL may be connected to a gate of the switching device TR. In addition, a first source/drain electrode of the switching device TR may be electrically connected to the electrode 101 of the magnetic tunneling junction device 100 and a second source/drain electrode of the switching device TR may be electrically connected to a selection line SL. The selection line SL may extend parallel with the word line. In this structure, one or more of a write current, a read current, an erase current, etc. may be applied to the memory cell MC through the word line WL and the bit line BL. In FIG. 16, it is shown that the memory cell MC includes the magnetic tunneling junction device 100 shown in FIG. 1, but in some example embodiments, the memory cell MC may include a magnetic tunneling junction device of other example embodiments.

Figure 17:
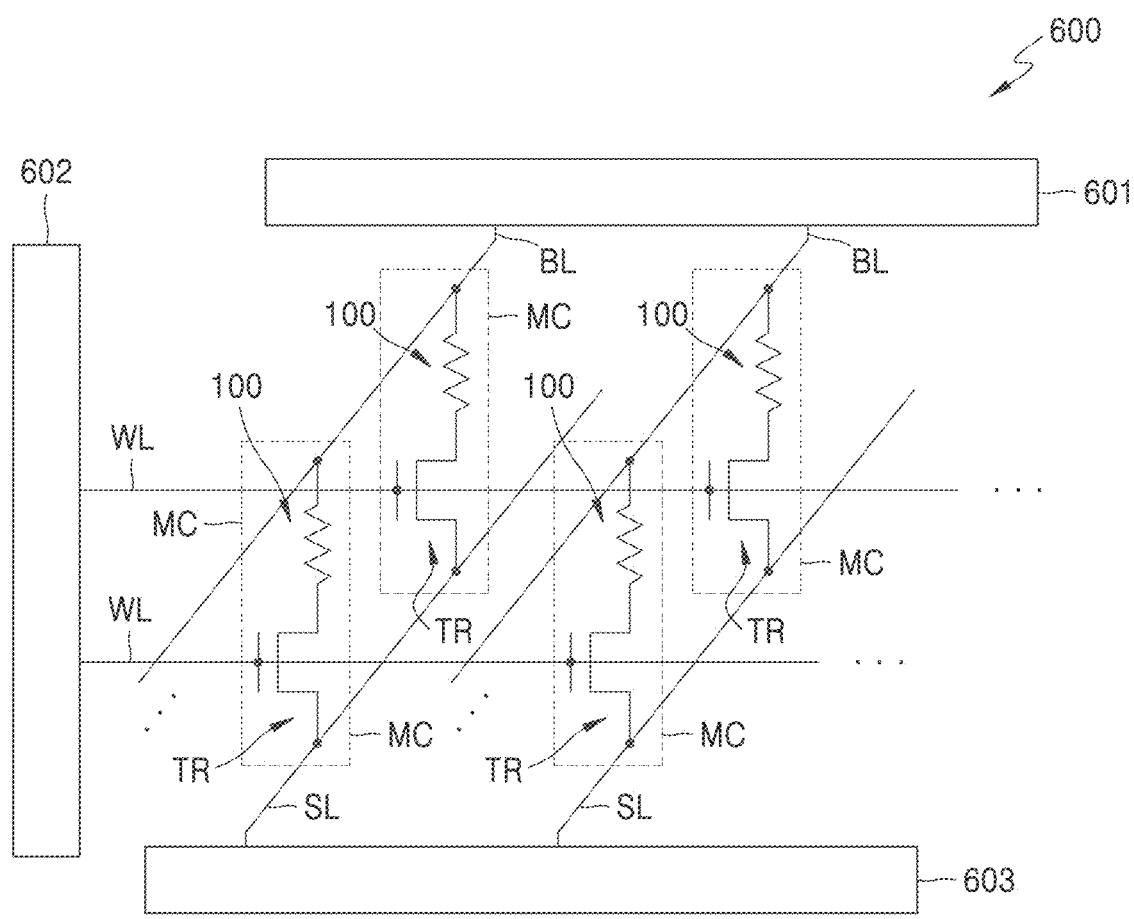
FIG. 17 is a circuit diagram schematically illustrating a configuration of a memory device including a plurality of memory cells shown in FIG. 16.

FIG. 17 is a circuit diagram schematically illustrating a configuration of a memory device 600 including the plurality of memory cells MCs shown in FIG. 16. Referring to FIG. 17, the memory device 600 may include a plurality of bit lines BL, a plurality of word lines WL, a plurality of selection lines SL, the plurality of memory cells MCs respectively disposed in intersection points of the plurality of bit lines BL and the plurality of word lines WL, a bit line driver 601 applying current to the plurality of bit lines BL, a word line driver 602 applying current to the plurality of word lines WL and a selection line driver 603 applying current to the plurality of selection lines SL. Each memory cell MC may have the configuration shown in FIG. 16. The memory device 600 may be a "1T1MTJ" device, e.g. a one transistor, one magnetic tunneling junction device.

The memory device 600 illustrated in FIG. 17 may be or may include a magnetic random access memory (MRAM), and may be used in electronic devices using nonvolatile memory. In particular, the memory device 600 illustrated in FIG. 17 may be or may include an STT-MRAM in which a magnetization direction of a free layer is changed by a spin current directly applied to the free layer of the magnetic tunneling junction device. The STT-MRAM does not require or use a separate wire for generating an external magnetic field, and thus the STT-MRAM may be advantageous for high integration and has a simple operation method. In addition, the memory device 600 shown in FIG. 17 may also be applied to SOT-MRAM.

Figure 18:
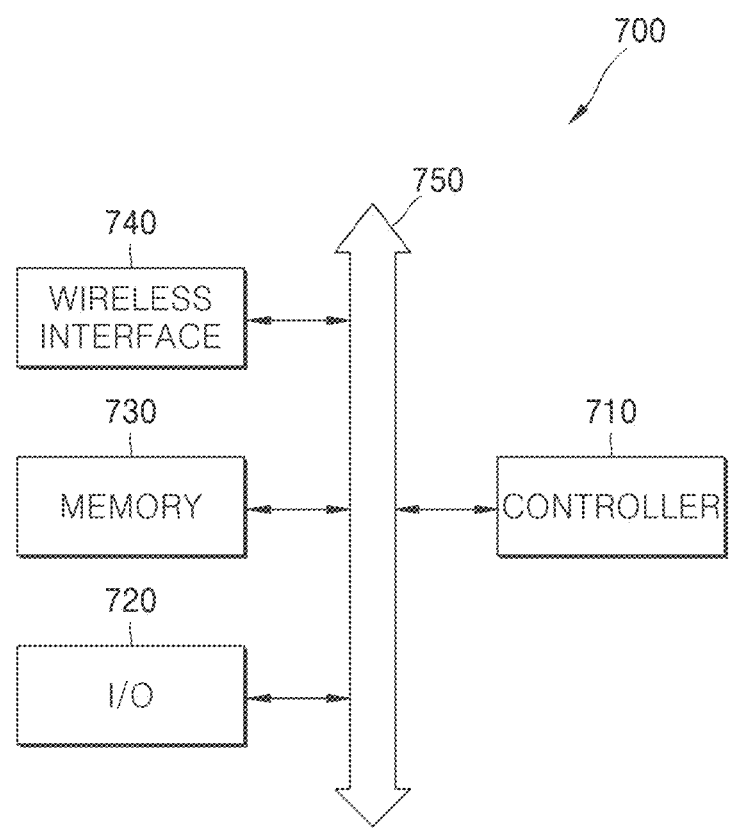
FIG. 18 is a block diagram of an electronic apparatus according to some example embodiments.

FIG. 18 is a block diagram of an electronic apparatus 700 according to some example embodiments. Referring to FIG. 18, an electronic apparatus 700 may constitute a wireless communication device, or a device capable of transmitting and/or receiving information in a wireless environment. The electronic apparatus 700 includes a controller 710, an input/output (I/O) device 720, a memory 730, and a wireless interface 740, which are interconnected through a bus 750.

The controller 710 may include at least one of a microprocessor, a digital signal processor, or a processing apparatus similar thereto. The I/O device 720 may include at least one of a keypad, a keyboard, and a display. The memory 730 may be used to store commands executed by controller 710. For example, the memory 730 may be used to store user data.

In some example embodiments, the memory 730 may include a magnetic tunneling junction device such as one or more of the magnetic tunneling junction devices 100 described above.

The electronic apparatus 700 may use the wireless interface 740 to transmit/receive data through a wireless communication network. The wireless interface 740 may include an antenna and/or a wireless transceiver. In some embodiments, the electronic apparatus 700 may be used for a communication interface protocol of a third generation communication system, for example, one or more of a code division multiple access (CDMA), a global system for mobile communications (GSM), a north American digital cellular (NADC), an extended-time division multiple access (E-TDMA), and/or a wide band code division multiple access (WCDMA).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of example embodiments. Moreover, when the words "generally" and "substantially" are used in connection with material composition, it is intended that exactitude of the material is not required but that latitude for the material is within the scope of various example embodiments.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Although the magnetic tunneling junction device and the memory device including the magnetic tunneling junction device are described with reference to the drawings, it should be understood that embodiments described herein should be considered in a descriptive sense only and not for purposes of limitation. Descriptions of features and/or aspects within each embodiment should typically be considered as available for other similar features and/or aspects in other embodiments. While one or more embodiments have been described with reference to the figures, it will be understood by those of ordinary skill in the art that various changes in form and details may be made therein without departing from the spirit and scope as defined by the following claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A magnetic tunneling junction device comprising:
   a pinned layer having a first surface and a second surface opposite the first surface;
   a seed layer contacting the first surface of the pinned layer;
   a free layer facing the second surface of the pinned layer; and
   a tunnel barrier layer between the pinned layer and the free layer,
   wherein the seed layer comprises a first seed layer facing the first surface of the pinned layer and a second seed layer between the first seed layer and the pinned layer,
   the first seed layer comprises at least one amorphous CoFeX and does not comprises boron (B),
   the X comprises at least one element selected from molybdenum (Mo), tungsten (W), chromium (Cr), and hafnium (Hf), and
   the second seed layer comprises amorphous tantalum (Ta).

2. The magnetic tunneling junction device of claim 1, wherein a proportion of the X in CoFeX is 5 at % to 50 at %.

3. The magnetic tunneling junction device of claim 1, wherein a thickness of the first seed layer is 5 Å to 20 Å.

4. The magnetic tunneling junction device of claim 1, wherein a thickness of the second seed layer is 5 Å to 10 Å.

5. The magnetic tunneling junction device of claim 1, wherein a sum of a thickness of the first seed layer and a thickness of the second seed layer is 10 Å to 30 Å.

6. The magnetic tunneling junction device of claim 5, wherein the thickness of the second seed layer is less than the thickness of the first seed layer.

7. The magnetic tunneling junction device of claim 1, further comprising:
an anti-crystallized layer between the pinned layer and the tunnel barrier layer; and
a polarization enhancing layer between the anti-crystallized layer and the tunnel barrier layer.

8. The magnetic tunneling junction device of claim 7, wherein the seed layer and the anti-crystallized layer are in an amorphous state at a temperature of 300° C. to 500° C.

9. A magnetic tunneling junction device comprising:
a pinned layer having a first surface and a second surface opposite the first surface;
a seed layer contacting the first surface of the pinned layer;
a free layer facing the second surface of the pinned layer;
a tunnel barrier layer between the pinned layer and the free layer;
an anti-crystallized layer between the pinned layer and the tunnel barrier layer; and
a polarization enhancing layer between the anti-crystallized layer and the tunnel barrier layer,
wherein the seed layer comprises a first seed layer facing the first surface of the pinned layer and a second seed layer between the first seed layer and the pinned layer,
the first seed layer comprises at least one amorphous CoFeX and does not comprises boron (B),
the X comprises at least one element selected from niobium (Nb), molybdenum (Mo), tungsten (W), chromium (Cr), zirconium (Zr), and hafnium (Hf),
the second seed layer comprises amorphous tantalum (Ta),
the anti-crystallized layer comprises at least one of YCo, YFe, YCoFe, YCoB, YFeB, or YCoFeB, and
the Y comprises at least one element selected from tungsten (W), rhenium (Re), molybdenum (Mo), and tantalum (Ta).

10. The magnetic tunneling junction device of claim 9, wherein
the anti-crystallized layer comprises YFeB,
a proportion of FeB in the anti-crystallized layer is 20 at % to 60 at %, and
a proportion of boron (B) in the FeB is 10 at % to 30 at %.

11. The magnetic tunneling junction device of claim 9, wherein a thickness of the anti-crystallized layer is 1.5 Å to 10 Å.

12. The magnetic tunneling junction device of claim 7, wherein the polarization enhancing layer comprises CoFeB.

13. The magnetic tunneling junction device of claim 7, wherein the polarization enhancing layer comprises:
a first polarization enhancing layer in contact with the anti-crystallized layer; and
a second polarization enhancing layer between the first polarization enhancing layer and the tunnel barrier layer.

14. The magnetic tunneling junction device of claim 13, wherein each of the first polarization enhancing layer and the second polarization enhancing layer comprises CoFeB, and a proportion of boron (B) in the second polarization enhancing layer is less than a proportion of boron (B) in the first polarization enhancing layer.

15. The magnetic tunneling junction device of claim 14, wherein
the proportion of boron (B) in the first polarization enhancing layer is 25 at % to 35 at %, and
the proportion of boron (B) in the second polarization enhancing layer is 15 at % to 25 at %.

16. The magnetic tunneling junction device of claim 14, wherein a thickness of the second polarization enhancing layer is less than a thickness of the first polarization enhancing layer.

17. The magnetic tunneling junction device of claim 16, wherein the thickness of the first polarization enhancing layer is 5 Å to 7 Å, and the thickness of the second polarization enhancing layer is 1 Å to 3 Å.

18. The magnetic tunneling junction device of claim 17, wherein
the pinned layer comprises a first ferromagnetic layer in contact with the seed layer, a second ferromagnetic layer in contact with the anti-crystallized layer, and a synthetic antiferromagnet (SAF) coupling layer between the first ferromagnetic layer and the second ferromagnetic layer, and
a magnetization direction of the first ferromagnetic layer and a magnetization direction of the second ferromagnetic layer are opposite to each other.

19. The magnetic tunneling junction device of claim 1, further comprising: an oxide layer on the free layer.

20. A memory device comprising:
a plurality of magnetic tunneling junction devices; and
a plurality of switching devices, each of the plurality of switching devices being connected to a respective one of plurality of magnetic tunneling junction devices,
wherein the respective one of the plurality of magnetic tunneling junction devices comprises:
a pinned layer having a first surface and a second surface opposite the first surface;
a seed layer contacting with the first surface of the pinned layer;
a free layer facing the second surface of the pinned layer; and
a tunnel barrier layer between the pinned layer and the free layer,
wherein the seed layer comprises a first seed layer facing the first surface of the pinned layer and a second seed layer between the first seed layer and the pinned layer,
the first seed layer comprises at least one amorphous CoFeX and does not comprises boron (B),
the X comprises at least one element selected from molybdenum (Mo), tungsten (W), chromium (Cr), and hafnium (Hf), and
the second seed layer comprises amorphous tantalum (Ta).

* * * * *